(12) United States Patent
Kim et al.

(10) Patent No.: US 11,308,874 B2
(45) Date of Patent: Apr. 19, 2022

(54) DISPLAY DEVICE

(71) Applicant: Samsung Display Co., Ltd., Yongin-si (KR)

(72) Inventors: Tae Young Kim, Seongnam-si (KR); Jong Woo Park, Seongnam-si (KR); Hyo Jung Kim, Suwon-si (KR); Ki Ju Im, Suwon-si (KR); Young Tae Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 7 days.

(21) Appl. No.: 16/358,700

(22) Filed: Mar. 20, 2019

(65) Prior Publication Data

US 2019/0392758 A1 Dec. 26, 2019

(30) Foreign Application Priority Data

Jun. 21, 2018 (KR) .................. 10-2018-0071683

(51) Int. Cl.

| | |
|---|---|
| *G09G 3/3233* | (2016.01) |
| *G09G 3/3266* | (2016.01) |
| *H01L 29/78* | (2006.01) |
| *G09G 3/3291* | (2016.01) |
| *H01L 27/32* | (2006.01) |

(52) U.S. Cl.
CPC ......... *G09G 3/3233* (2013.01); *G09G 3/3266* (2013.01); *G09G 3/3291* (2013.01); *H01L 27/3276* (2013.01); *H01L 29/78391* (2014.09); *G09G 2300/0426* (2013.01); *G09G 2300/0452* (2013.01); *G09G 2300/0809* (2013.01)

(58) Field of Classification Search
CPC ...................... G09G 3/3233; G09G 2320/045
See application file for complete search history.

(56) References Cited

U.S. PATENT DOCUMENTS

| | | | | |
|---|---|---|---|---|
| 5,270,231 A | * | 12/1993 | Sameshima | ....... H01L 21/31051 257/E21.009 |
| 5,342,648 A | | 8/1994 | Mackenzie et al. | |
| 6,072,454 A | * | 6/2000 | Nakai | ................... G02F 1/1368 345/97 |
| 6,714,435 B1 | * | 3/2004 | Dimmler | ................. G11C 11/22 257/E27.104 |
| 7,420,213 B2 | * | 9/2008 | Chae | .................... H01L 27/124 257/59 |
| 7,573,083 B2 | * | 8/2009 | Kijima | ............. H01L 27/11502 257/192 |

(Continued)

*Primary Examiner* — William Boddie
*Assistant Examiner* — Bipin Gyawali
(74) *Attorney, Agent, or Firm* — H.C. Park & Associates, PLC

(57) ABSTRACT

A display device including an emitting element. A first transistor includes a first electrode electrically connected to a first supply voltage line, a second electrode electrically connected to the emitting element, and a gate electrode receiving a data signal, the first transistor being configured to transfer a driving current to the emitting element based on the data signal. A capacitor is connected between the gate electrode of the first transistor and the first supply voltage line. An electric field generating element is connected between the second electrode of the first transistor and the gate electrode of the first transistor and includes ferroelectrics.

5 Claims, 19 Drawing Sheets

(56) References Cited

U.S. PATENT DOCUMENTS

| | | | |
|---|---|---|---|
| 7,675,059 B2* | 3/2010 | Kim | C08F 212/24 |
| | | | 257/40 |
| 7,750,342 B2* | 7/2010 | Kim | C08G 73/0611 |
| | | | 257/40 |
| 8,139,189 B2 | 3/2012 | Sawatari et al. | |
| 8,455,954 B2* | 6/2013 | Suzuki | H01L 29/78621 |
| | | | 257/379 |
| 8,558,295 B2* | 10/2013 | Yoon | G11C 11/22 |
| | | | 257/295 |
| 9,318,596 B2* | 4/2016 | Fabiano | H01L 29/78 |
| 10,720,505 B2* | 7/2020 | Then | H01L 29/2003 |
| 2008/0261333 A1 | 10/2008 | Xianyu et al. | |
| 2011/0012889 A1* | 1/2011 | Miyamoto | G09G 3/344 |
| | | | 345/212 |
| 2011/0095272 A1* | 4/2011 | Ng | H01L 27/11507 |
| | | | 257/40 |
| 2011/0299318 A1* | 12/2011 | Kaneko | H01L 29/516 |
| | | | 365/145 |
| 2015/0187270 A1* | 7/2015 | Lee | G09G 3/3258 |
| | | | 345/76 |
| 2020/0098925 A1* | 3/2020 | Dewey | H01L 29/78 |
| 2020/0105788 A1* | 4/2020 | Majhi | H01L 29/423 |
| 2020/0212224 A1* | 7/2020 | Penumatcha | H01L 29/41725 |

* cited by examiner

DISPLAY DEVICE

CROSS REFERENCE TO RELATED APPLICATION

This application claims priority from and the benefit of Korean Patent Application No. 10-2018-0071683, filed on Jun. 21, 2018, which is hereby incorporated by reference for all purposes as if fully set forth herein.

BACKGROUND

Field

Exemplary embodiments of the invention relate to a display device.

Discussion of the Background

Display devices become more and more important as multimedia technology evolves. Accordingly, a variety of types of display devices such as a liquid-crystal display (LCD) device and an organic light-emitting display (OLED) device are currently used. The organic light-emitting display device displays images by using an organic light-emitting diode that emits light as electrons and holes recombine. The organic light-emitting display device includes a plurality of transistors for providing a driving current to the organic light-emitting diode. Electrical characteristics of the transistors of a display device may be changed or degraded as the display device is used over time.

The above information disclosed in this Background section is only for understanding of the background of the inventive concepts, and, therefore, it may contain information that does not constitute prior art.

SUMMARY

Exemplary embodiments of the invention provide a display device for preventing electrical characteristics of the transistors from being changed.

Additional features of the inventive concepts will be set forth in the description which follows, and in part will be apparent from the description, or may be learned by practice of the inventive concepts.

An exemplary embodiment of the invention provides a display device including an emitting element; a first transistor including a first electrode electrically connected to a first supply voltage line, a second electrode electrically connected to the emitting element, and a gate electrode receiving a data signal, the first transistor being configured to transfer a driving current to the emitting element based on the data signal; a capacitor connected between the gate electrode of the first transistor and the first supply voltage line; and an electric field generating element connected between the second electrode of the first transistor and the gate electrode of the first transistor, the electric field generating element including ferroelectrics.

The ferroelectrics may include barium titanate ($BaTiO_3$) or strontium titanate ($SrTiO_3$).

A non-emission voltage across the second electrode of the first transistor and the gate electrode of the first transistor may have a first polarity during a non-emission period in which the emitting element emits no light. An emission voltage across the second electrode of the first transistor and the gate electrode of the first transistor may have a second polarity different from the first polarity during an emission period in which the emitting element emits light.

A first electric field may be formed between the second electrode and the gate electrode of the first transistor based on the non-emission voltage during the non-emission period, the ferroelectrics may be polarized in a first polarization direction based on the first electric field, and at least a part of the ferroelectrics may maintain a polarization state in the first polarization direction during the emission period, to form a remnant electric field.

The ferroelectrics may exhibit saturation polarization by the first electric field.

A second electric field may be formed between the second electrode of the first transistor and the gate electrode of the first transistor based on the emission voltage during the emission period, and at least a part of the second electric field may be canceled by the remnant electric field.

The display device may further includes a first scan line transferring a first scan signal; a second scan line transferring a second scan signal different from the first scan signal; a data line transferring the data signal; an initialization voltage line transferring an initialization voltage; a second transistor including a first electrode receiving the data signal, a second electrode electrically connected to the first electrode of the first transistor, and a gate electrode receiving the first scan signal; a third transistor including a first electrode electrically connected to the second electrode of the first transistor, a second electrode electrically connected to the gate electrode of the first transistor, and a gate electrode receiving the scan signal; a fourth transistor including a first electrode electrically connected to the initialization voltage line, a second electrode electrically connected to the gate electrode of the first transistor, and a gate electrode receiving the second scan signal; a fifth transistor including a first electrode electrically connected to the first supply voltage line, a second electrode electrically connected to the first electrode of the first transistor, and a gate electrode receiving an emission control signal; a sixth transistor including a first electrode electrically connected to the second electrode of the first transistor, a second electrode electrically connected to an anode electrode of the emitting element, and a gate electrode receiving the emission control signal; and a seventh transistor including a first electrode electrically connected to the initialization voltage line, a second electrode electrically connected to the anode electrode of the emitting element, and a gate electrode receiving the second scan signal.

The emission control signal may have a logic high level during a non-emission period in which the pixel emits no light, the non-emission period may include a first period, the first scan signal may have a logic high level during the first period, the second scan signal may have a logic low level during the first period, the fourth transistor may be turned on in response to the second scan signal during the first period, and the initialization voltage may be applied to the gate electrode of the first transistor.

The ferroelectrics may be polarized based on the initialization voltage during the first period.

The ferroelectrics may exhibit saturation polarization by the initialization voltage.

The initialization voltage may be variable in the first period.

A polarization induction voltage having a polarity different from the polarity of the initialization voltage may be applied to the second electrode of the first transistor during the first period.

A voltage difference between the polarization induction voltage and the initialization voltage may be greater than or equal to a voltage across the second electrode and the gate electrode of the first transistor during the emission period in which the pixel emits light.

The display device may further include a second electric field generating element connected between the first electrode and the gate electrode of the first transistor.

The second electric field generating element may be formed integrally with the first electric field generating element.

Another exemplary embodiment of the invention provides a display device including a substrate; a semiconductor layer disposed on the substrate, the semiconductor layer including a first region, a second region disposed on one side of the first region where a first electrode of a transistor is formed, and a third region disposed on another side of the first region where a second electrode of the transistor is formed; a first insulating layer disposed on the semiconductor layer; a first conductive layer disposed on the first insulating layer and including a gate electrode overlapping with the first region; and a ferroelectric layer disposed on the first insulating layer and overlapping with at least a part of the second region of the semiconductor layer.

The ferroelectric layer may be in direct contact with the gate electrode and may partially overlap with the gate electrode.

The ferroelectric layer may overlap with at least a part of the first region.

The ferroelectric layer may be in direct contact with the gate electrode and may not overlap with the gate electrode.

The ferroelectric layer may overlap with at least a part of the first region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
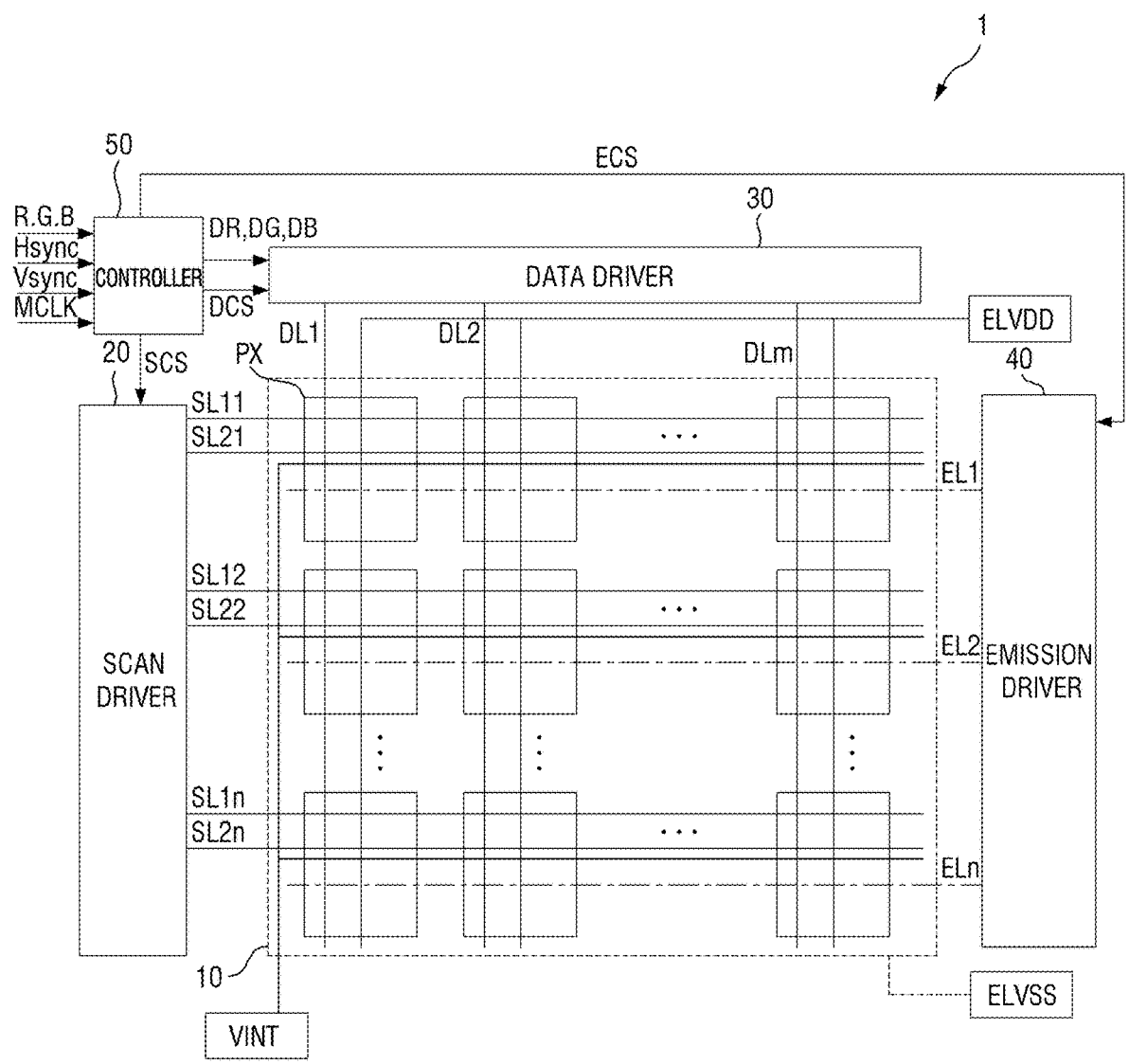
FIG. 1 is a block diagram illustrating a display device according to exemplary embodiments of the invention.

In the following description, for the purposes of explanation, numerous specific details are set forth in order to provide a thorough understanding of various exemplary embodiments of the invention. As used herein, "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of a display device according to an exemplary embodiment of the invention.

Referring to FIG. 1, a display device 1 may include a display part 10 including pixels PX (reference pixels or unit pixels), a scan driver 20, a data driver 30, an emission driver 40, and a controller 50.

The display device 1 (or the display part 10) may include scan lines SL11 to SL1n and SL21 to SL2n and data lines DL1 to DLm, and emission control lines EL1 to ELn, where n and m are integers of 2 or more. The pixels PX may be disposed at the intersections of the scan lines SL11 to SL1n and SL21 to SL2n, the data lines DL1 to DLm, and the emission control lines EL1 to ELn. Each of the pixels PX may be a minimum display unit for displaying an image or a color. The pixels PX will be described later with reference to FIG. 2.

The scan lines SL11 to SL1n and SL21 to SL2n may be extended generally in the row direction. The emission control lines EL1 to ELn may be extended substantially in the row direction. The data lines DL1 to DLm may be extended substantially in the column direction. The row direction and the column direction are interchangeable.

The display device 100 may also include an initialization voltage wiring (or initialization voltage supply line), a first supply voltage wiring (or a first supply voltage supply line), and a second supply voltage wiring (or a second supply voltage supply line).

The initialization voltage line is for supplying the initialization voltage VINIT to the pixels PX and may be divided into rows and may be extended in the row direction. The first supply voltage line is for supplying the first supply voltage ELVDD to the pixels PX and may be divided into the columns and may be extended in the column direction. The second supply voltage line may be arranged in the form of a mesh and may supply a second supply voltage ELVSS to the pixels PX different from the first supply voltage. It is, however, to be understood that the inventive concepts are not limited thereto. The initialization voltage line and the lines of the first supply voltage may be extended in a variety of directions.

Each of the pixels PX may be connected to two scan lines, one data line, one emission control line, one initialization voltage line, and one first supply voltage line. For example, the pixel PX located in the first row (or the first pixel row) and the first column (or the first pixel column) (hereinafter referred to as the eleventh pixel) may be connected to the eleventh and twenty-first scan lines SL11 and SL21, the first data line DL1, the first emission control line EL1, one initialization voltage line, and one first supply voltage line.

The scan driver 20 may generate first and second scan signals and may provide the first and second scan signals to the pixels PX through the scan lines SL11 to SL1n and SL21 to SL2n. The first and second scan signals will be described later with reference to FIGS. 2 and 3.

The data driver 30 may provide data signals to the pixels PX through the data lines DL1 to DLm. For example, when the first scan signals are supplied to the pixel PX of the first row and the first column (i.e., the eleventh pixel) through the first scan line SL11, a data signal may be provided to the eleventh pixel.

The emission driver 40 may generate emission control signals and may provide the emission control signals to the pixels PX through the emission control lines EL1 to ELn. The emission driver 40 (or the display device 1) may adjust the emission time of the pixels PX based on the emission control signals. Although the emission driver 40 is implemented separately from the scan driver 20 in the example shown in FIG. 1, the inventive concepts are not limited thereto. For example, the emission driver 40 may be implemented in the scan driver 20 as a single element. In other exemplary embodiments, the emission driver 40 may be entirely eliminated depending on the circuit configuration of the pixels PX.

The controller 50 may convert image signals R, G, and B transferred from an external device (for example, an application processor) into image data signals DR, DG and DB, to deliver them to data driver 30. In addition, the controller 50 may receive the vertical synchronization signal Vsync, the horizontal synchronization signal Hsync, and the clock signal MCLK; generate control signals to control the operation of the scan driver 20, the data driver 30, and the emission driver 40, and may provide the control signals to each of the scan driver 20, the data driver 30, and the emission driver 40, respectively. The control signals may include a scan control signal SCS for controlling the scan driver 20, a data control signal DCS for controlling the data driver 30, and an emission control signal ECS for controlling the emission driver 40.

The display device 1 may further include a power supply (not shown). The power supply may generate a first supply voltage ELVDD, a second supply voltage ELVSS, and an initialization voltage VINIT and may supply the first supply voltage ELVDD, the second supply voltage ELVSS, and the initialization voltage VINIT to the pixels PX through a first supply voltage line, a second supply voltage line, and an initialization voltage line. The first supply voltage ELVDD may be a predetermined high-level voltage, and the second supply voltage ELVSS may be a predetermined low-level voltage. The voltage level of the second supply voltage ELVSS may be lower than the voltage level of the first supply voltage ELVDD. The power supply may be implemented as an external voltage source.

Each of the pixels PX may emit light with a predetermined luminance based on the driving current supplied to the organic light-emitting diode according to the data signal transmitted through the data lines DL1 to DLm.

Figure 2:
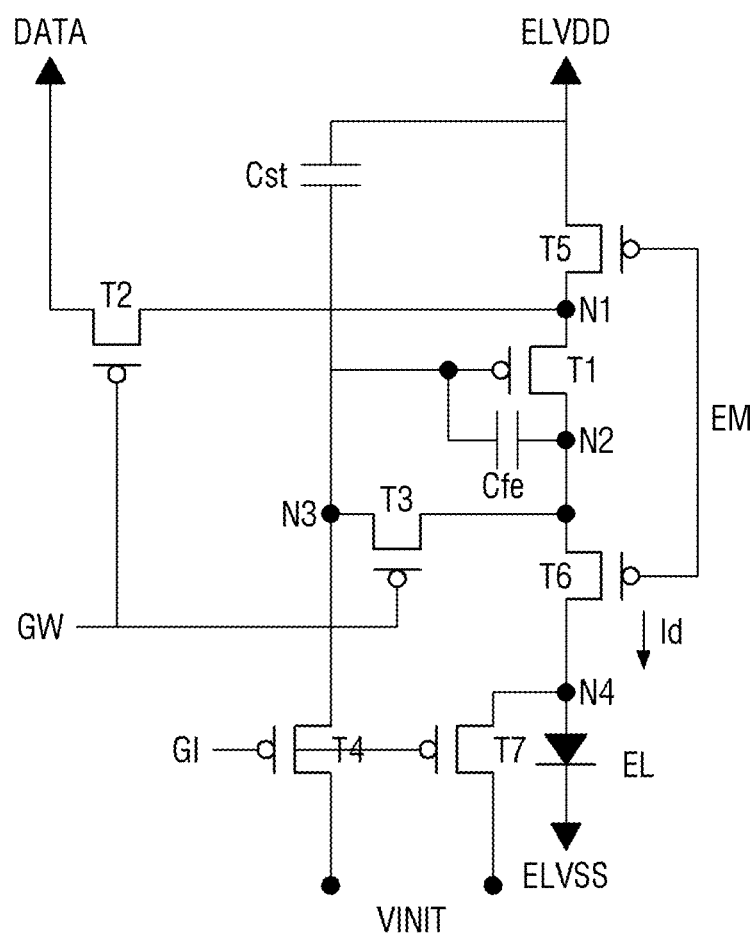
FIG. 2 is a circuit diagram illustrating an example of one of the pixels included in the display device of FIG. 1.

FIG. 2 is a circuit diagram showing an example of one of the pixels included in the display device of FIG. 1.

Referring to FIG. 2, each of the pixels PX may include an emitting element EL (or organic light-emitting diode), first to seventh transistors T1 to T7, and a capacitor Cst. A data signal DATA, a first scan signal GW, and a second scan signal GI may be provided to the pixels PX. The second scan signal GI may be the same as the first scan signal GW of the previous time point or previous row. For example, the second scan signal GI[n] provided to the pixel of the $n^{th}$ row may be the same as the first scan signal GW[n−1] provided to the pixel of the $(n−1)^{th}$ row.

Each of the first to seventh transistors T1 to T7 may include a first electrode, a second electrode, and a gate electrode. One of the first electrode and the second electrode may be a source electrode, and the other of the first electrode and the second electrode may be a drain electrode.

Each of the first to seventh transistors T1 to T7 may be a thin-film transistor. Each of the first to seventh transistors T1 to T7 may be a PMOS transistor or an NMOS transistor. In the following description, the first to seventh transistors T1 to T7 will be described as PMOS transistors.

The emitting element EL may include an anode electrode and a cathode electrode. The anode electrode of the emitting element EL may be connected to a fourth node N4, and the cathode electrode thereof may be connected to the second supply voltage line (i.e., the line for transmitting the second supply voltage ELVSS).

The first transistor T1 (or the driving transistor) may include a first electrode connected to a first node N1, a second electrode N2 connected to a second node, and a gate electrode connected to a third node N3. The first transistor T1 may provide the driving current Id to the emitting element EL based on the voltage at the third node N3 (or the data voltage stored in the capacitor Cst described later).

In some exemplary embodiments, the first transistor T1 (or the pixel PX, the display panel 10, the display device 1) may include an electric field generating element Cfe. The electric field generating element Cfe may be disposed (or interposed) or connected (or directly connected) between the gate electrode and the second electrode of the first transistor T1.

The electric field generating element Cfe may include ferroelectrics. A first electric field is formed between the second electrode and the gate electrode of the first transistor T1 by a voltage across the second electrode and the gate electrode (for example, a drain-gate voltage at a first time point) and the electric field generating element Cfe (or the ferroelectrics) may be polarized to have the first direction or the first polarity by the first electric field. Then, even after the first electric field diminishes, the electric field generating element Cfe (or the ferroelectrics) may maintain the polarization state or may have remnant polarization. A remnant electric field (or auxiliary electric field) may be formed or generated in the first direction depending on the polarization state. The electric field generating element Cfe may be formed in the second direction (i.e., the second direction opposite to the first direction) between the gate electrode and the second electrode of the first transistor TI using the remnant electric field, or may offset at least a part of the second electric field having the second polarity (i.e., the second polarity opposite to the first polarity). Thus, deterioration or change in electrical characteristics of the first transistor T1 due to the second electric field can be prevented or mitigated.

The configuration and function of the electric field generating element Cfe will be described later with reference to FIGS. 5 to 11.

The second transistor T2 (or a switching transistor) may include a first electrode connected to the data line (or receiving the data DATA), a second electrode connected to the first node N1, and a gate electrode connected to a first scan line (for example, the first scan line SL1 shown in FIG. 1) or receiving the first scan signal GW. The second transistor T2 may be turned on in response to the first scan signal GW and may transmit the data signal DATA to the first node N1.

The third transistor T3 may include a first electrode connected to the second node N2, a second electrode connected to the third node N3, and a gate electrode connected to the first scan line or receiving the first scan signal GW. The third transistor T3 may be turned on in response to the first scan signal GW and may transmit the data signal DATA to the third node N3.

The capacitor Cst may be connected or formed between the third node N3 and the first supply voltage ELVDD. The capacitor Cst may store or maintain the received data signal DATA.

The fourth transistor T4 may include a first electrode connected to the third node N3, a second electrode connected to the initialization voltage line or receiving the initialization voltage VINIT, and a gate electrode connected to the second scan line (for example, the second scan line SL21 or receiving the second scan signal GI).

The fourth transistor T4 may be turned on in response to the second scan signal GI before the data signal DATA is stored in the capacitor Cst or after the emitting element EL emits light, and may initialize a third node N3 (or the capacitor Cst) using the initialization voltage VINIT.

In an exemplary embodiment, each of the third and fourth transistors T3 and T4 may be implemented as a dual transistor (i.e., a transistor in the form of a combination of two transistors). Such a dual transistor can prevent or reduce the leakage current of the third and fourth transistors T3 and T4 and the degradation of the display quality due to the leakage current.

The fifth transistor T5 and the sixth transistor T6 (or the first and second emission control transistors) may be connected between the first supply voltage line and the emitting element EL, such that a path can be formed through which the driving current Id generated by the first transistor T1 Id can move.

The fifth transistor T5 may include a first electrode connected to the first supply voltage line and receiving the first supply voltage ELVDD, a second electrode coupled to the first node N1, and a gate electrode connected to the emission control signal line (for example, a first emission control signal line EL1 shown in FIG. 1) for receiving the emission control signal EM.

Similarly, the sixth transistor T6 may include a first electrode connected to the second node N2, a second electrode coupled to the fourth node N4 (or the anode electrode of the emitting element EL), and a gate electrode connected to the emission control signal line (for example, the first emission control signal line EL1 shown in FIG. 1) for receiving the emission control signal EM.

The fifth and sixth transistors T5 and T6 are turned on in response to the emission control signal EM and then the driving current Id is supplied to the emitting element EL. The emitting element EL may emit light with a luminance proportional to the magnitude of the driving current Id.

The seventh transistor T7 may include a first electrode connected to the fourth node N4, a second electrode connected to the initialization voltage line (for receiving initialization voltage VINIT), and a gate electrode connected to the second scan signal line (for example, a second scan signal line SL21 shown in FIG. 1) for receiving the second scan signal GI.

The seventh transistor T7 is turned on in response to the second scan signal GI before or after the emitting element EL emits light and may initialize the anode electrode of the emitting element EL by using the initialization voltage VINIT. The emitting element EL may have a parasitic capacitor formed between the anode electrode and the cathode electrode (or the second supply voltage ELVSS). The parasitic capacitor may be charged while the emitting element EL emits light, such that the anode electrode of the emitting element EL may have a certain voltage. Therefore, the emitting element EL may be initialized by the seventh transistor T7.

Figure 3:
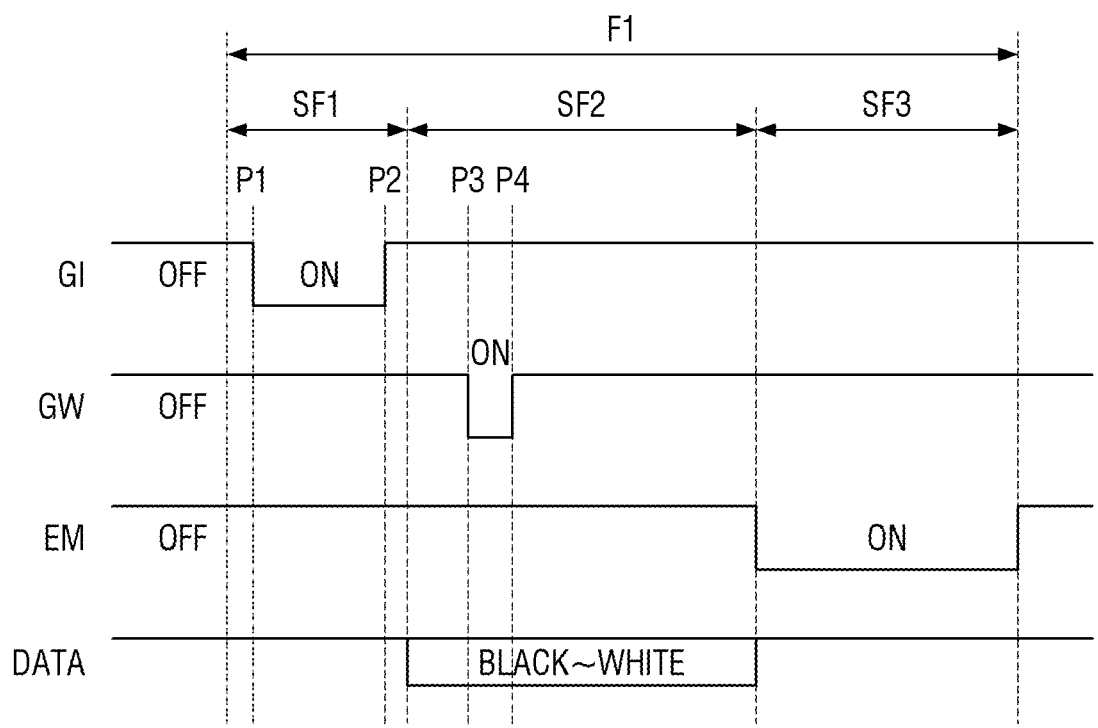
FIG. 3 is a waveform diagram illustrating an example of signals provided to the pixel of FIG. 2.
Figure 4:
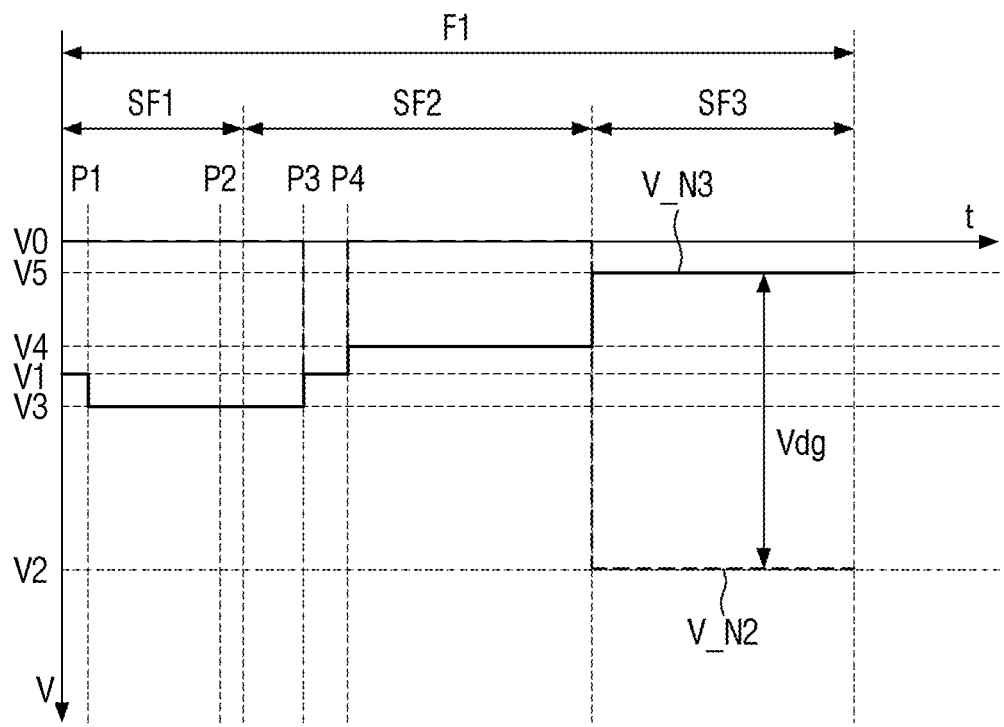
FIG. 4 is a waveform diagram illustrating an example of signals measured in the pixel of FIG. 2.

FIG. 3 is a waveform diagram showing an example of signals provided to the pixel of FIG. 2. FIG. 4 is a waveform diagram showing an example of signals measured in the pixel of FIG. 2.

Referring to FIGS. 2 to 4, one frame F1 may include first to third sub-frames SF1, SF2, and SF3. The frame F1 may be a minimum time unit in which the display device 1 displays one image. The first and second sub-frames SF1 and SF2 may be non-emission periods in which the pixel PX does not emit light, and the third sub-frame SF3 may be an emission period in which the pixel PX emits light.

In the first sub-frame SF1, the second scan signal GI (or the second previous scan signal) may have a logic low-level (or turn-on voltage level, turn-on voltage) between the first point of time P1 and the second point of time P2. In this case, the fourth transistor T4 and the seventh transistor T5 may be turned on in response to the second scan signal GI at the logic low-level, and the third node N3 and the fourth node N4 may be initialized based on the initialization voltage VINIT. That is to say, the first sub-frame SF1 may be an initialization period.

The first scan signal GW and the emission control signal EM may have a logic high-level (or a turn-off voltage level, a turn-off voltage). Accordingly, the first, second, third, fifth and sixth transistors T1, T2, T3, T5 and T6 are turned off and may maintain the turn-off state.

As shown in FIG. 4, the third node voltage V_N3 at the third node N3 (or the gate electrode of the first transistor T1) may be initialized by the initialization voltage VINIT and may have the third voltage level V3 from the first time point P1 to the second time point P2. The third voltage level V3 is equal to the voltage level of the initialization voltage VINIT, for example, the third voltage level V3 may be approximately −5 V.

On the other hand, the second node N2 (or the second electrode of the first transistor 1) may have a reference voltage level V0 (for example, 0 V) higher than the third voltage level V3 at the third node N3.

During the second sub-frame SF2, the second scan signal GI and the emission control signal EM may have a logic high-level. Therefore, the fourth to seventh transistors T4, T5, T6, and T7 may be turned off or remain in the turn-off state.

The first scan signal GW may have a logic low-level at the third time point P3 to the fourth time point P4. Then, the second and third transistors T2 and T3 may be turned on, and the data signal DATA may be transmitted to the third node N3 via the first node N1 and the second node N2. The first transistor T1 may be turned on in response to the initialization voltage VINIT and the data signal DATA (i.e., the data signal DATA transmitted through the third transistor T3) to transmit the data signal DATA from the first node N1 to the second node N2.

The data signal DATA may have a low gray level data signal (BLACK) to a high gray level data signal (WHITE) corresponding to various gray levels. The data signal DATA may be supplied to the pixel PX during a period of time in which the first scan signal GW has a logic low-level (for example, from the third time point P3 to the fourth time point P4) (or a time point).

As shown in FIG. 4, at the third time point P3, the second node voltage V_N2 at the second node N2 and the third node voltage V_N3 at the third node N3 may have a first voltage level V1 in response to the data signal DATA. At the fourth time point P4, as the third transistor T3 is turned off, the voltage V_N2 at the second node may rise back to the reference voltage level V0. The voltage V_N3 at third node can hold the voltage equal to the data signal DATA by the capacitor Cst.

During the third sub-frame SF3, the second scan signal GI, and the first scan signal GW may have a logic high-level. Then, the second, third, fourth, and seventh transistors T2, T3, T4, and T7 may be turned off or remain turned off.

The emission control signal EM may have a logic high-level. Therefore, the fifth and sixth transistors T5 and T6 may be turned on. The first transistor T1 may transmit the driving current Id corresponding to the data signal DATA to the emitting element EL. Therefore, the emitting element EL may emit light with the luminance corresponding to the data signal DATA (or the driving current Id).

As shown in FIG. 4, the third node voltage V_N3 at the third node N3 may have a fifth voltage level V5 corresponding to the data signal DATA. For example, when the data signal DATA corresponds to a relatively low one of the gray levels, the fifth voltage level V5 may be approximately 1 V.

The second node voltage V2 at the second node N2 may have the second voltage level V2, and the second voltage level V2 may be similar to the second supply voltage ELVSS as the sixth transistor T6 is turned on. For example, the second voltage level V2 may be approximately 10 V.

During the third sub-frame SF3 (or the emission period), a voltage Vdg across the second node N2 and the third node N3 (or a voltage difference, for example, the drain-gate voltage of the first transistor T1, hereinafter, referred to as "stress voltage") may become larger as the data signal DATA is lower in gray level. The first transistor T1 of the pixel PX may be deteriorated by the stress voltage Vdg in the third sub-frame SF3 or its electrical characteristics may be changed even though the pixel PX emits light with a relatively low luminance corresponding to the low gray level.

Hereinafter, changes in the electrical characteristics and display quality of the first transistor T1 due to the stress voltage Vdg will be described, and the configuration for maintaining the electrical characteristics of the first transistor T1 using the electric field generating element Cfe will be described.

Figure 5:
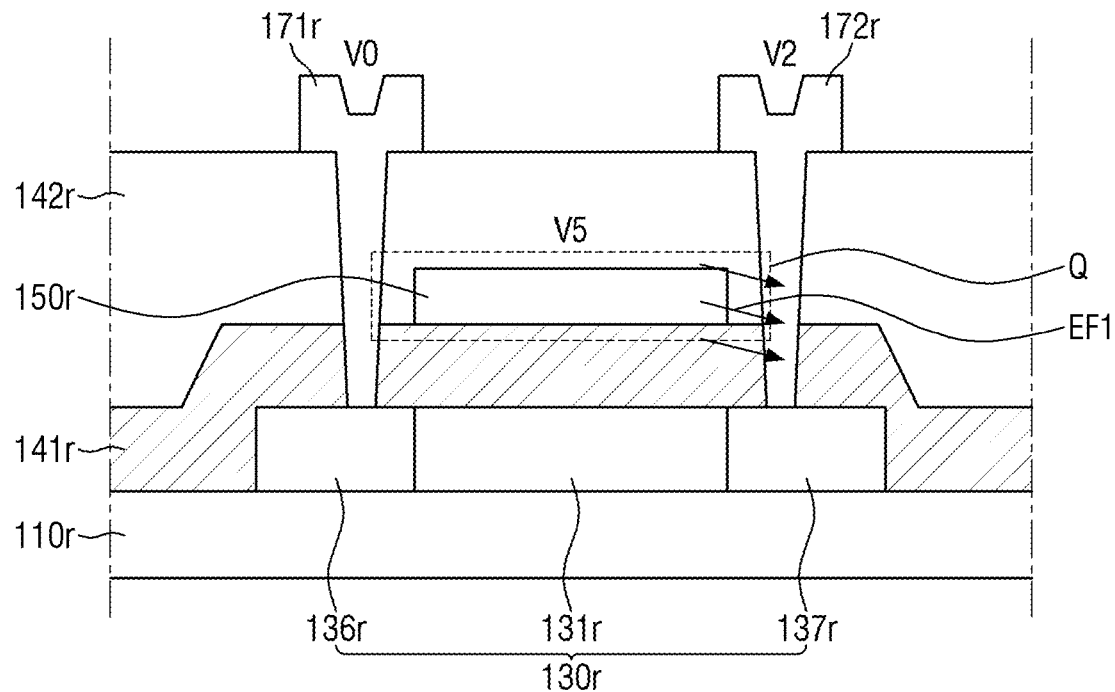
FIG. 5 is a cross-sectional diagram illustrating Comparative Example of the pixel of FIG. 2.
Figure 6:
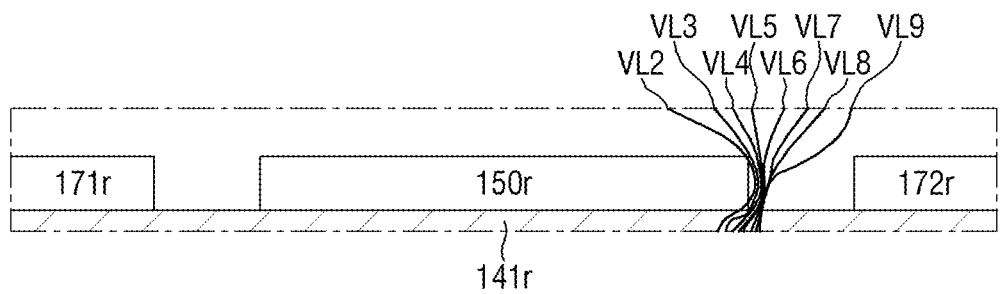
FIG. 6 is a diagram in which area Q of FIG. 5 is enlarged.
Figure 7:
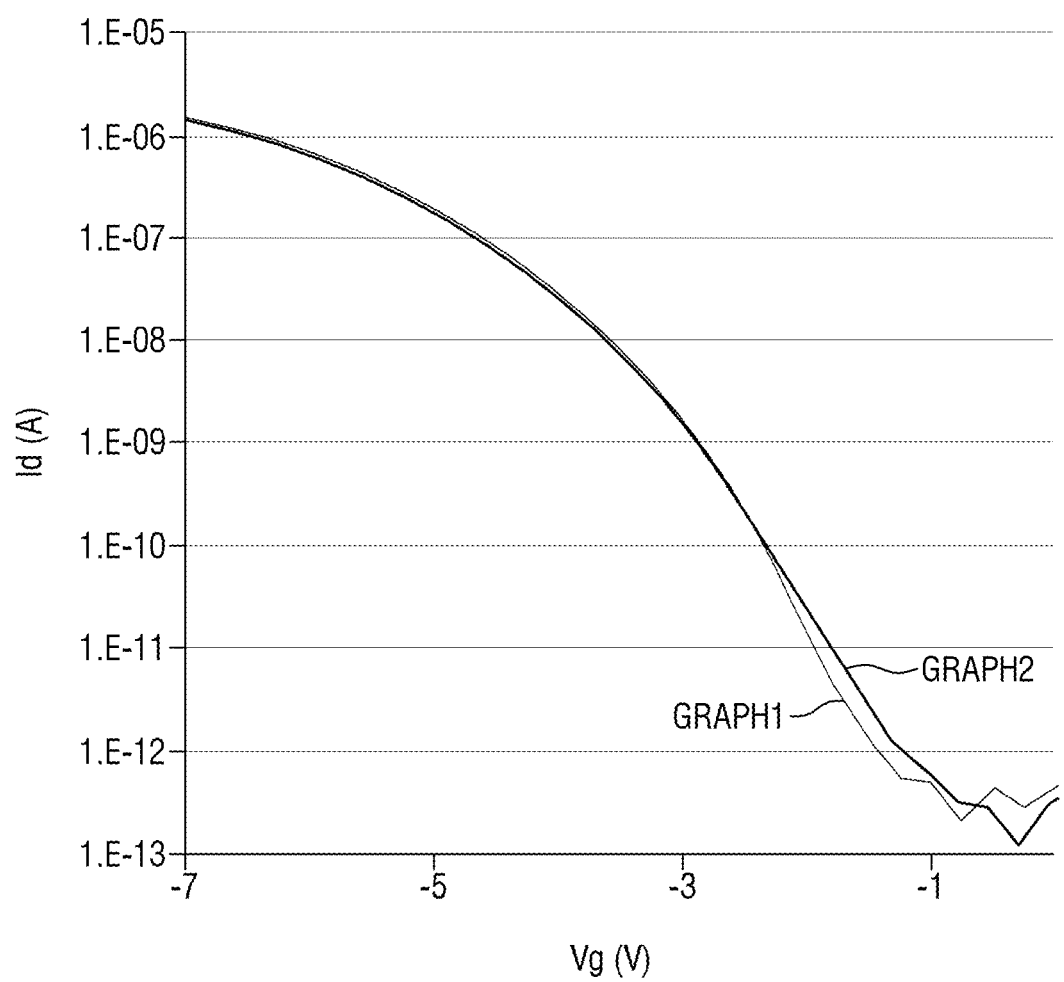
FIG. 7 is a diagram illustrating the electrical characteristics of the pixel of FIG. 2.
Figure 8:
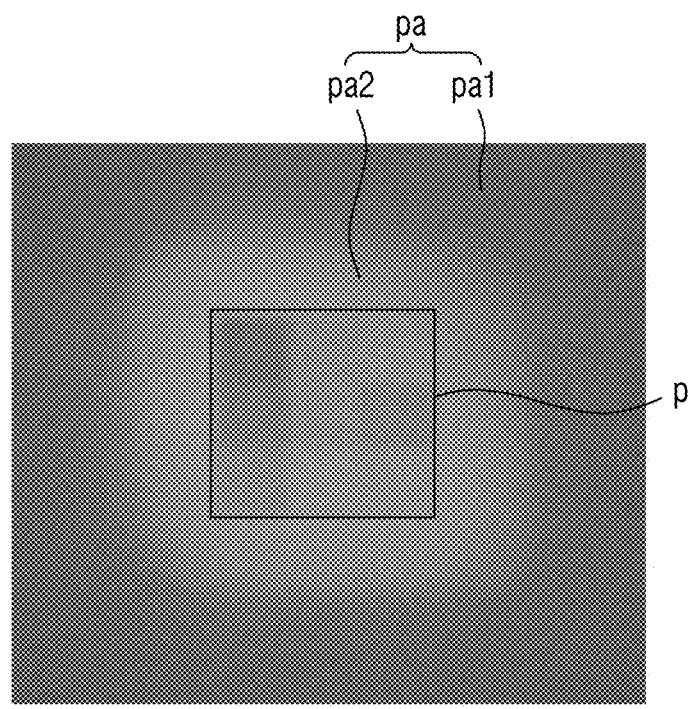
FIG. 8 is a diagram illustrating an example of an image displayed on the display device of FIG. 1.

FIG. 5 is a cross-sectional view showing Comparative Example of the pixel of FIG. 2. FIG. 6 is an enlarged view of area Q of FIG. 5. FIG. 7 is a graphic showing the electrical characteristics of the pixel of FIG. 2. FIG. 8 is a view showing an example of an image displayed on the display device of FIG. 1.

Referring to FIGS. 2 to 5, the display device 1 may include a substrate 110r, a semiconductor layer 130r, a first insulating layer 141r, a first conductive layer 150r, a second insulating layer 142r, and the second conductive layer 170r. The first transistor T1 described above with reference to FIG. 2 may be formed across the substrate 110r, the semiconductor layer 130r, the first insulating layer 141r, the first conductive layer 150r, the second insulating layer 142r, and the second conductive layer 170r. Although the first transistor T1 is shown as having a top-gate structure, the inventive concepts are not limited thereto.

The substrate 110r supports the layers disposed thereon. A transparent substrate may be used when the display device 1 is of a bottom-emission or both-sided emission type. When the display device 1 is of a top-emission type, a semitransparent or opaque substrate as well as a transparent substrate may be employed.

The substrate 110r may be made of an insulating material such as glass, quartz, and a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 110r may include a metal material.

The semiconductor layer 130r is an active layer forming the channel 131r of the first transistor T1.

The semiconductor layer 130r may include polycrystalline silicon. The polycrystalline silicon may be formed by crystallizing amorphous silicon. As another example, the semiconductor layer 130r may include monocrystalline silicon, low-temperature polycrystalline silicon, amorphous silicon, or the like.

The portions of the semiconductor layer 130r that are connected to the source/drain electrodes of each of the first transistors T1 (i.e., source/drain regions 136r and 137r) may be doped with impurity ions (p-type impurity ions in case of PMOS transistors). A trivalent dopant, such as boron (B), may be used as the p-type impurity ions.

The first insulating layer 141r may be disposed on the semiconductor layer 130r and may be disposed over the entire surface of the substrate 110r. The first insulating layer 141r may be a gate insulating layer having a gate insulating function.

The first insulating layer 141r may include a silicon compound, a metal oxide, etc. For example, the first insulating layer 141r may include silicon oxide, silicon nitride, silicon oxynitride, aluminum oxide, tantalum oxide, hafnium oxide, zirconium oxide, titanium oxide, etc. They may be used alone or in combinations. The first insulating layer 141r may be made up of a single layer or multiple layers of different materials stacked on one another.

The first conductive layer 150r is disposed on the first insulating layer 141r. The first conductive layer 150r may include a gate electrode of the first transistor T1.

The first conductive layer 150r may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 150r may be made up of a single layer or multiple layers.

The second insulating layer 142r may be disposed on the first conductive layer 150r and may be disposed over the entire surface of the substrate 110r. The second insulating layer 142r serves to insulate the first conductive layer 150r from the second conductive layer 170r and may be an interlayer dielectric layer.

The second insulating layer 142r may include an inorganic insulating material, such as silicon oxide, silicon nitride, silicon oxynitride, hafnium oxide, aluminum oxide, titanium oxide, tantalum oxide, and zinc oxide, or an organic insulating material such as polyacrylates resin, epoxy resin, phenolic resin, polyamides resin, polyimides resin, unsaturated polyesters resin, poly phenylenethers resin, polyphenylenesulfides resin, and benzocyclobutene (BCB). The second insulating layer 142r may be made up of a single layer or multiple layers of different materials stacked on one another.

The second conductive layer 170r is disposed on the second insulating layer 142r. The second conductive layer 170r may include a source electrode 171r, and a drain electrode 172r of the first transistor T1. The source electrode 171r may be electrically connected to the source region 136r via the through hole exposing the source region 136r of the semiconductor layer 130r passing through the first and second insulating layers 141r and 142r. Similarly, the drain electrode 172r may be electrically connected to the drain region 137r via the through hole exposing the drain region 137r of the semiconductor layer 130r passing through the first and second insulating layers 141r and 142r.

The second conductive layer 170r may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

As described above with reference to FIG. 4, during the third sub-frame SF3 (or emission period), the gate electrode of the first transistor T1 may have the fifth voltage level V5 and the drain electrode of the first transistor T1 may have may have a second voltage level V2. When the data signal DATA of the low gray level (for example, the gray level corresponding to black) is provided to the pixel PX, for example, the gate voltage of the first transistor T1 may be −1 V, the drain voltage may be −10 V, and the stress voltage Vdg (or drain-gate voltage) may be −9 V.

In this instance, as shown in FIG. 6, the equipotential lines VL2, VL3, VL4, VL5, VL6, VL7, VL8, and VL9 are locally concentrated in the drain region of the first transistor T1 by the stress voltage Vdg. Accordingly, a high electric field EF1 may be formed or generated in the drain region of the first transistor T1.

In addition, a hot electron induced punchthrough (HEIP) occurs due to the stress voltage Vdg, such that the first transistor T1 may be deteriorated. The HEIP may refer to a phenomenon that the activity (or collision) of the electrons is increased by the stress voltage Vdg, and, accordingly, the space charge region is widened.

Referring to FIG. 7, a first curve GRAPH1 shows the voltage-current characteristics of a reference transistor, while a second curve GRAPH2 shows the voltage-current characteristics of the deteriorated transistor shown in FIG. 5.

The reference transistor refers to a transistor which does not receive a relatively large stress voltage Vdg or receives a relatively small stress voltage. The deteriorated transistor refers to a transistor which has received a relatively large stress voltage Vdg for a long period of time.

As shown in FIG. 7, the second curve GRAPH2 may be similar to the first curve GRAPH1 in the high gray level region, while the second curve GRAPH2 may be higher than the first curve GRAPH1 in the low gray level region. For example, for the gate voltage Vg of −5 V to −7 V corresponding to a high gray level, the reference transistor and the deteriorated transistor may transmit the driving current Id of 10 nA to 10 μA, which are similar to each other. As another example, for the gate voltage Vg of approximately −2 V corresponding to a low gray level, the reference transistor may transmit the driving current Id of approximately 0.1 nA, while the deteriorated transistor may transmit the driving current Id of approximately 0.3 nA. That is to say, in response to the same low gray level data voltage, the deteriorated transistor may emit light with a luminance higher than that of the reference transistor.

FIG. 8 shows a halo phenomenon appearing in a display image resulted from the deterioration and/or a change in electric characteristics of the first transistor T1 included in the pixel PX.

The halo phenomenon is defined as a phenomenon in which the display device having a high luminance pattern p and a peripheral area pa that surrounds the high luminance pattern p and has the black gray level are driven for a long period of time, the luminance of a second area pa2 of the peripheral area pa that is closer to the high luminance pattern p has a higher luminance than a first area pa1 thereof that is more distant from the high luminance pattern p.

To display a black image in the peripheral area pa, a black bias is applied to the first transistor T1 of the pixel PX (especially the pixel circuit) disposed in the peripheral area pa. The black bias is defined as conditions required for presenting the black gray level. For example, it may include the voltage level of the signals provided to the gate electrode or the drain electrode of the first transistor T1, the voltage level of the first supply voltage ELVSS1, the voltage level of the second supply voltage ELVSS2, etc.

When the black bias is applied to the first transistor T1, the degree of deterioration of the first transistor T1 is increased due to the stress voltage Vdg (or black bias stress). The deterioration of the first transistor T1 may also be expressed as an increase in the driving range DR of the first transistor T1 shown in FIG. 9.

Under the same temperature condition, the driving range of the first transistor T1 may be larger when the black bias, e.g., the level of the drain voltage Vd (or the stress voltage Vdg) applied to the drain electrode of the first transistor T1 is higher than when the level Vd is lower.

Figure 9:
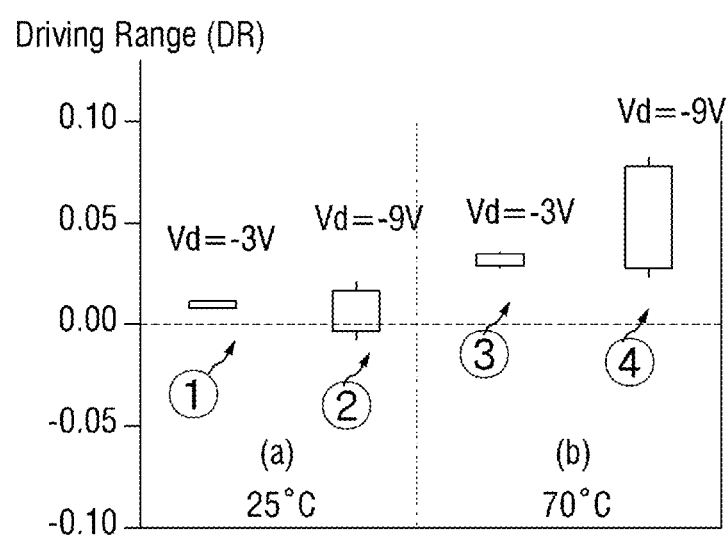
FIG. 9 is a diagram illustrating a change in the electrical characteristics of the pixel of FIG. 2.

Under the same black bias condition, the higher the temperature, the wider is the driving range DR of the first transistor T1 and the larger is the minimum value of the driving range DR. As shown in FIG. 9, for example, the driving range DR of the first transistor T1 is wider and the minimum value of the driving range DR may be larger at the region (b) where the temperature is higher than at the region (a) where the temperature is lower.

The temperature of the first transistor T1 of the pixel disposed within the range of the high luminance pattern p is increased by the self heating effect due to the implementation of the high luminance pattern p. Such increase in the temperature may also affect the first transistor T1 of the pixel disposed in the second area pa2 adjacent to the high luminance pattern p. Further, when a relatively large electric field is formed in the first transistor T1 by the black bias, the temperature may be increased due to the hot electron induced punchthrough.

In view of the above, the display device 1 according to the exemplary embodiments of the invention includes an electric field generating element disposed between the gate electrode (or the line connected to the gate electrode) and the drain electrode (or the line connected to the drain electrode) of the first transistor T1. The electric field generating element can reduce or offset the electric field formed by the stress voltage Vdg (or black bias stress) across the gate and drain electrodes. Thus, deterioration or a change in electrical characteristics of the first transistor T1 due to the black bias can be substantially prevented or mitigated.

Figure 10:
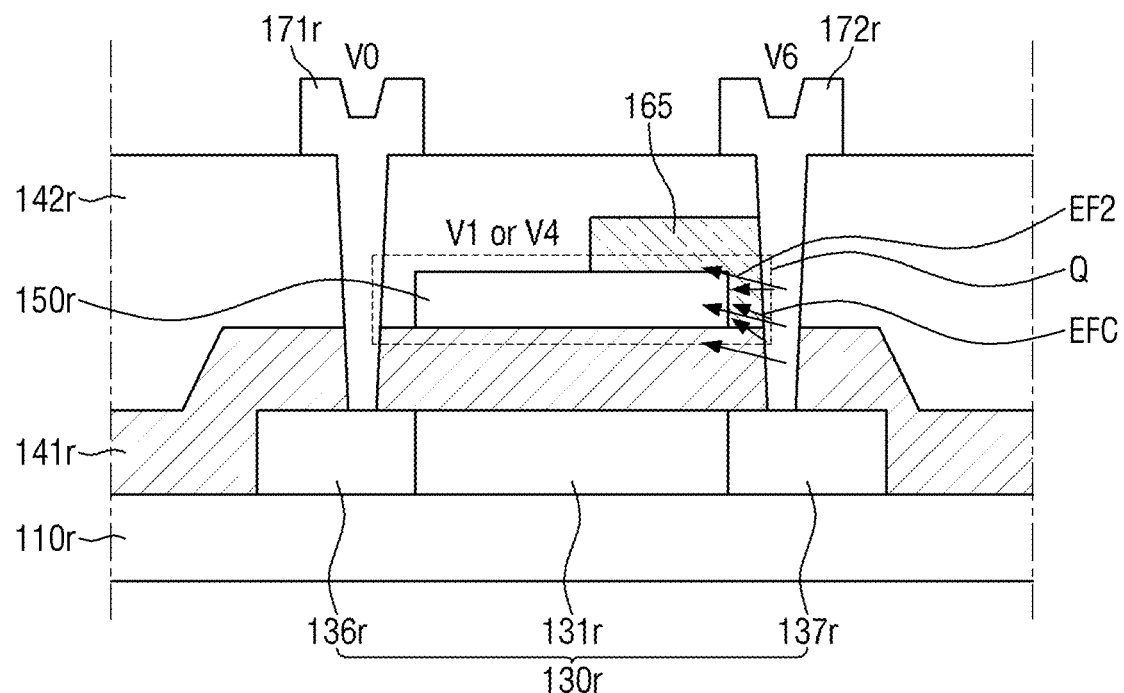
FIG. 10 and FIG. 11 are cross-sectional diagrams illustrating an example of the pixel of FIG. 2.
Figure 11:
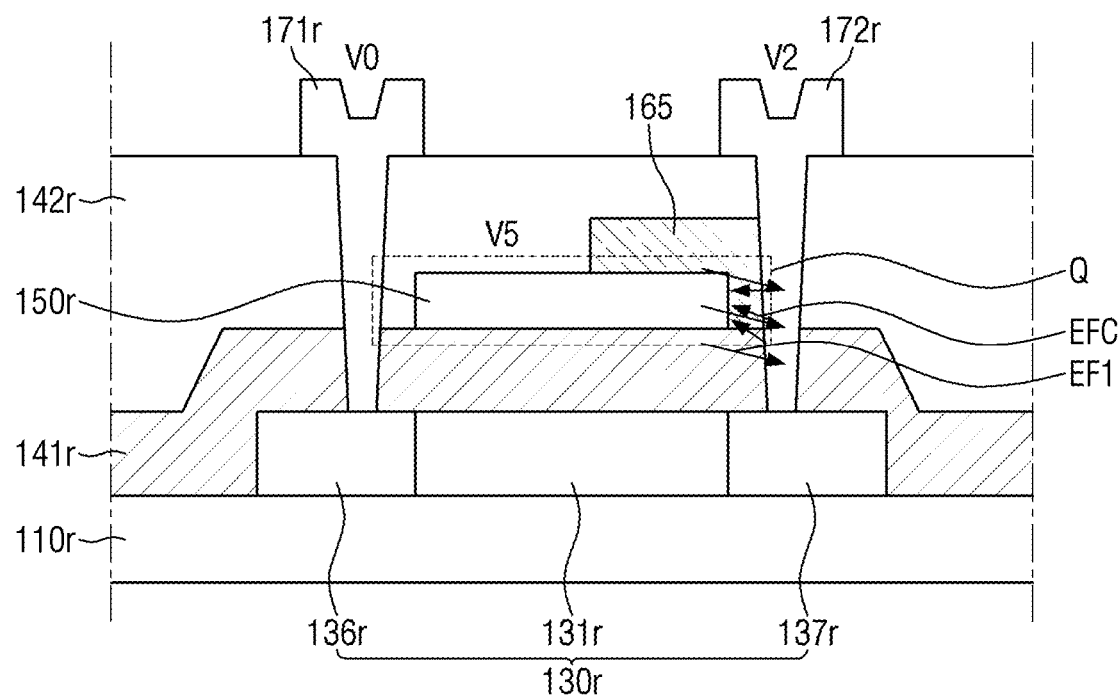
Figure 12:
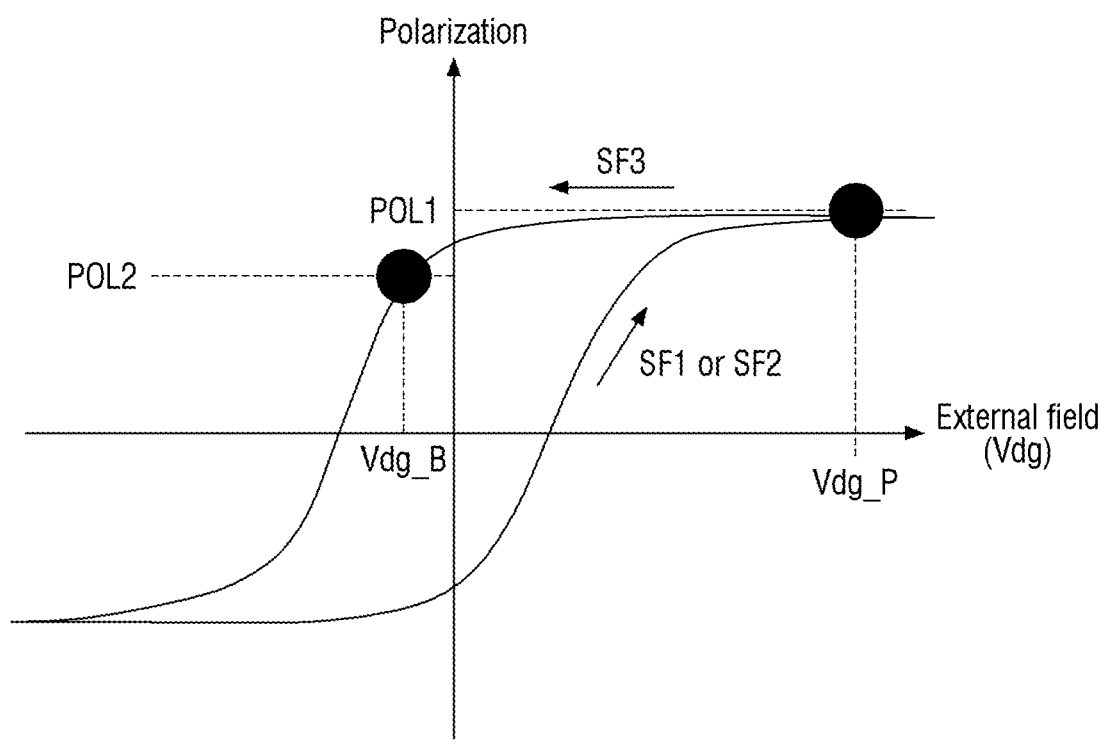
FIG. 12 is a diagram illustrating the characteristics of the ferroelectric layer included in the pixel of FIG. 10.

FIGS. 10 and 11 are cross-sectional views showing an example of the pixel of FIG. 2. FIG. 12 is a graph showing the characteristics of the ferroelectric layer included in the pixel of FIG. 10.

Referring to FIGS. 2 to 5 and 10 and 11, the display device 1 may further include the ferroelectric layer 165. The substrate 110r, the semiconductor layer 130r, the first insulating layer 141r, the first conductive layer 150r, the second insulating layer 142r, and the second conductive layer 170r included in the display device 1 are substantially identical to the substrate 110r, the semiconductor layer 130r, the first insulating layer 141r, the first conductive layer 150r, the second insulating layer 142r, and the second conductive layer 170r described above with reference to FIG. 5; and, therefore, any redundant descriptions will be omitted.

The ferroelectric layer 165 may be disposed between the first insulating layer 141r and the second insulating layer 142r. In addition, the ferroelectric layer 165 may be disposed between the gate electrode and the drain electrode 172r and may overlap with at least part of the gate electrode. The ferroelectric layer 165 may be in direct contact with the gate electrode and the drain electrode 172r.

The ferroelectric layer 165 may include or may be made of a ferroelectric substance. The ferroelectric substance is a material that has polarization by itself without the need for an external electric field (or spontaneous polarization). The orientation of the polarization may be switched by an external electric field. For example, the ferroelectric substance may be barium tantalate ($BaTiO_3$), strontium titanate ($SrTiO_3$), etc. In addition, the ferroelectric substance may be an amorphous ferroelectric substance. In this case, the ferroelectric layer 165 may be formed through a typical mask process. It is, however, to be understood that the inventive concepts are not limited thereto. The ferroelectric substance may be a crystalloid (or crystalline) ferroelectric substance.

As shown in FIG. 10, in the second sub-frame SF2 (or the first sub-frame SF1) described above with reference to FIGS. 3 and 4, for example, the gate voltage (voltage V1 or V4) of the first transistor T1 may be −4 V, and the drain voltage (voltage V0) may be 0 V. In this case, the stress voltage Vdg is 4 V, and the second electric field EF2 may be formed between the gate electrode and the drain electrode.

The ferroelectric layer 165 is polarized by the second electric field EF2 and may generate a remnant electric field (EFC) between the gate electrode and the drain electrode depending on the polarization state.

As shown in FIG. 11, in the third sub-frame SF3 described above with reference to FIGS. 3 and 4, the gate voltage (voltage V5) of the first transistor T1 (i.e., the gate voltage corresponding to the black gray level) may be −1 V, and the drain voltage (voltage V2) may be −10 V. In this case, the stress voltage Vdg is −10 V, and the first electric field EF1 may be formed between the gate electrode and the drain electrode. The first electric field EF1 may be formed from the gate electrode toward the drain electrode, unlike the second electric field EF1.

On the other hand, the polarization state of the ferroelectric layer 165 may be at least partially maintained, and thus the remnant electric field (EFC) may be maintained. Therefore, at least a part of the first electric field EF1 formed between the gate electrode and the drain electrode (that is, the electric field locally formed in the drain region of the first transistor T1) may be offset or mitigated by the remnant electric field (EFC). The deterioration of the first transistor T1 due to the first electric field EF1 and a change in electrical characteristics, and the like can be mitigated, and deterioration of the display quality can be prevented.

Referring to FIG. 12, a hysteresis curve of the ferroelectric layer 165 is shown. The horizontal axis represents the electric field (or the stress voltage Vdg) formed between the drain electrode and the gate electrode of the first transistor T1, and the vertical axis represents the polarization of the ferroelectric layer 165.

As described above, the ferroelectric layer 165 may have first polarization state POL1 by the second electric field EF2 (or the second drain-gate voltage Vdg_P) in the second sub-frame SF2 (or the first sub-frame SF1). Subsequently, even if the first electric field E1 diminishes, the first polarization state POL1 of the ferroelectric layer 165 may not diminish and may have residual polarization.

In the third sub-frame SF3, the polarization degree of the ferroelectric layer 165 is reduced by the first electric field EF1 (or the first drain-gate voltage Vdg_B), but may have the second polarization state POL2. The remnant electric field EFC can be maintained by the second polarization state POL2 of the ferroelectric layer 165.

On the other hand, when the electric field (or the stress voltage Vdg) causing the saturation polarization of the ferroelectric layer 165 is reversely formed, the ferroelectric layer 165 is polarized in the polarization direction opposite to the initial polarization direction, such that the polarization state of the ferroelectric layer 165 may change along the lower curve instead of the upper curve shown in FIG. 12.

Therefore, the voltage that causes saturation polarization of the ferroelectric layer 165 (hereinafter referred to as "saturation polarization voltage") may be applied across the drain electrode and the gate electrode of the first transistor T1 at the second sub-frame SF2 (or the first sub-frame SF1). At the third sub-frame SF3, a voltage less than the saturation polarization voltage may be applied across the drain electrode and the gate electrode of the first transistor T1. That is to say, the stress voltage Vdg_P at the second sub-frame SF2 (or the first sub-frame SF1) may be larger than the stress voltage Vdg_B at the third sub-frame SF3. It is, however, to be understood that the inventive concepts are not limited thereto. For example, when the stress voltage Vdg_B at the third sub-frame SF3 is not greater than the saturation polarization voltage (i.e., when the polarization state of the ferroelectric layer 165 does not change), the stress voltage Vdg_P at the first sub-frame SF1 may be equal to or less than the stress voltage Vdg_B at the third sub-frame SF3.

Figure 13:
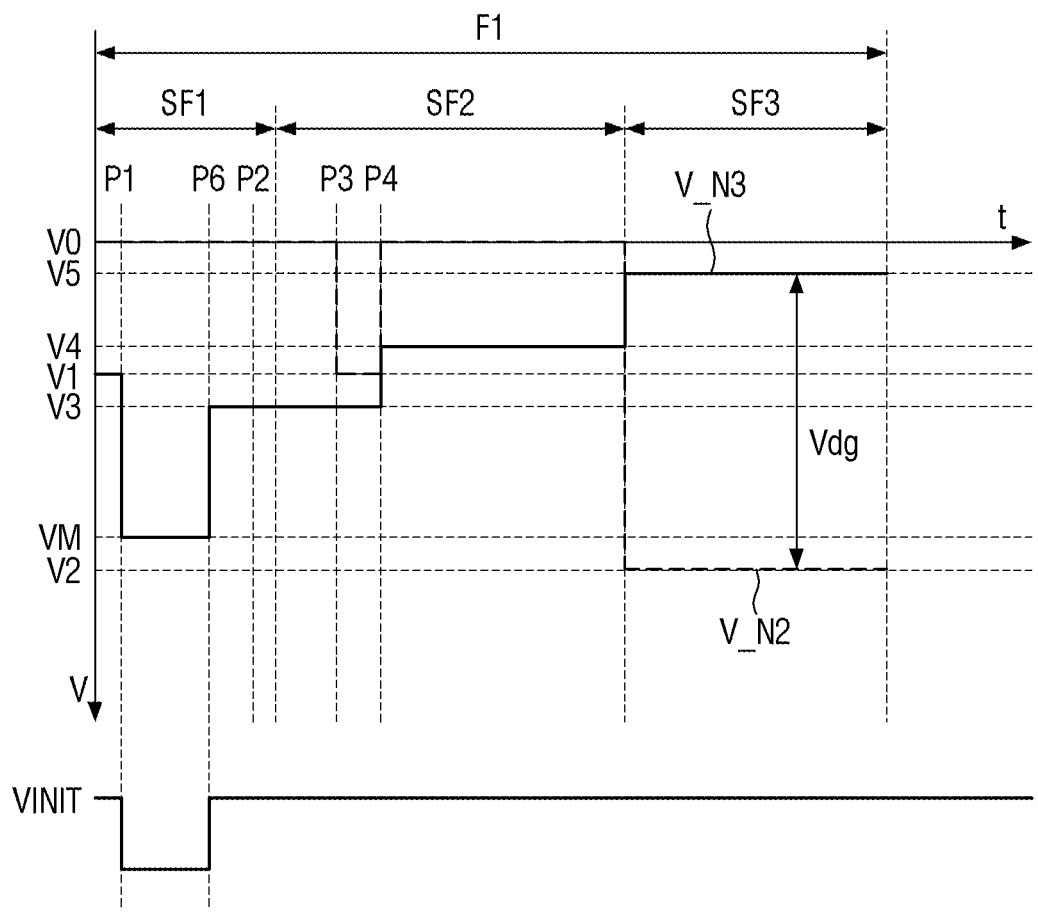
FIG. 13 and FIG. 14 are diagrams illustrating an example of signals measured in the pixel of FIG. 10.
Figure 14:
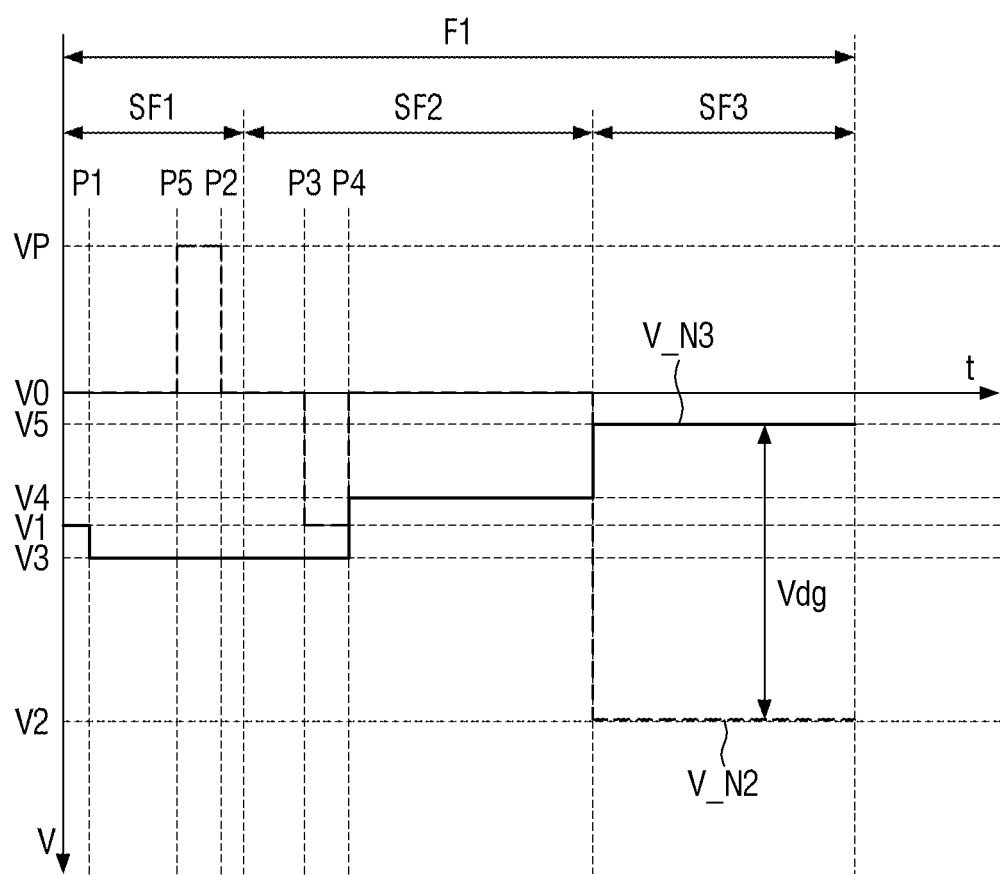

FIGS. 13 and 14 are views for showing examples of signals measured in the pixel of FIG. 10.

Initially, referring to FIGS. 4 and 13, the third node voltage V_N3 (i.e., the gate voltage of the first transistor T1) is different from the third node voltage V_N3 shown in FIG. 4 in that it has a first polarization induction voltage level VM in the first sub-frame SF1.

The first polarization induction voltage level VM (or the difference between the first polarization induction voltage level VM and the reference voltage level V0) is greater than or equal to the voltage level of the saturation polarization voltage of the ferroelectric 165, and may have a level equal to or greater than the stress voltage Vdg at the third sub-frame SF3.

For example, the initialization voltage VINIT may have the first polarization induction voltage level VM. Then, the initialization voltage VINIT may be applied to the third node N3 via the fourth transistor T4 during the first sub-frame SF1 and the third node voltage V_N3 may have the first polarization induction voltage level VM.

Therefore, the function of the ferroelectric layer 165 (or the electric field generating element Cfe) can be maintained, deterioration and a change in electrical characteristics of the first transistor T1, and the like can be prevented or mitigated more effectively.

Although the initialization voltage VINIT has been described as having the first polarization induction voltage level VM with reference to FIG. 13, the inventive concepts are not limited thereto. For example, at the first time point P1 to the sixth time point P6 shown in FIG. 14, the initialization voltage VINIT may have the first polarization induction voltage level VM and may have the third voltage level V3 in other time points (e.g., the sixth time point P6 to second time point P2). That is to say, the initialization voltage VINIT may be varied between the voltage level of the saturation polarization voltage for causing saturation polarization of the ferroelectric layer 165 and the voltage level for initializing the gate electrode of the first transistor T1 and the emitting element EL.

Referring to FIGS. 4 and 14, the second node voltage V_N2 (i.e., the voltage at the second electrode or the drain electrode of the first transistor T1) is different from the second node voltage V_N2 shown in FIG. 4 in that it has a second polarization induction voltage level VP in the first sub-frame SF1.

The difference between the second polarization induction voltage level VP and the first voltage level V1 (i.e., the voltage level of the gate voltage of the first transistor T1 in the first sub-frame SF1) may be greater than or equal to the voltage level of the saturation polarization voltage of the ferroelectric 165, and may have a level equal to or greater than the stress voltage Vdg at the third sub-frame SF3.

For example, the pixel PX of FIG. 2 may further include an eighth transistor (not shown) for transferring an external voltage having the second polarization induction voltage level VP to the second node N2. The eighth transistor may be turned on in response to the second scan signal GI. In this case, the second node voltage V_N2 may have the second polarization induction voltage level VP in the first sub-frame SF1.

As described above with reference to FIGS. 13 and 14, in the first and second sub-frames SF1 and SF2 that are before the third sub-frame SF3 (or the emission period), by applying the saturation polarization voltage (i.e., the voltage that causes saturation polarization of the ferroelectric layer 165 or the electric field generating element Cfe) between the gate electrode and the second electrode of the first transistor T1, the functionality of the ferroelectric layer 165 (or the electric field generating element Cfe) can be maintained, and the deterioration and a change in the electrical characteristics of the first transistor T1 can be more effectively prevented or mitigated.

Figure 15:
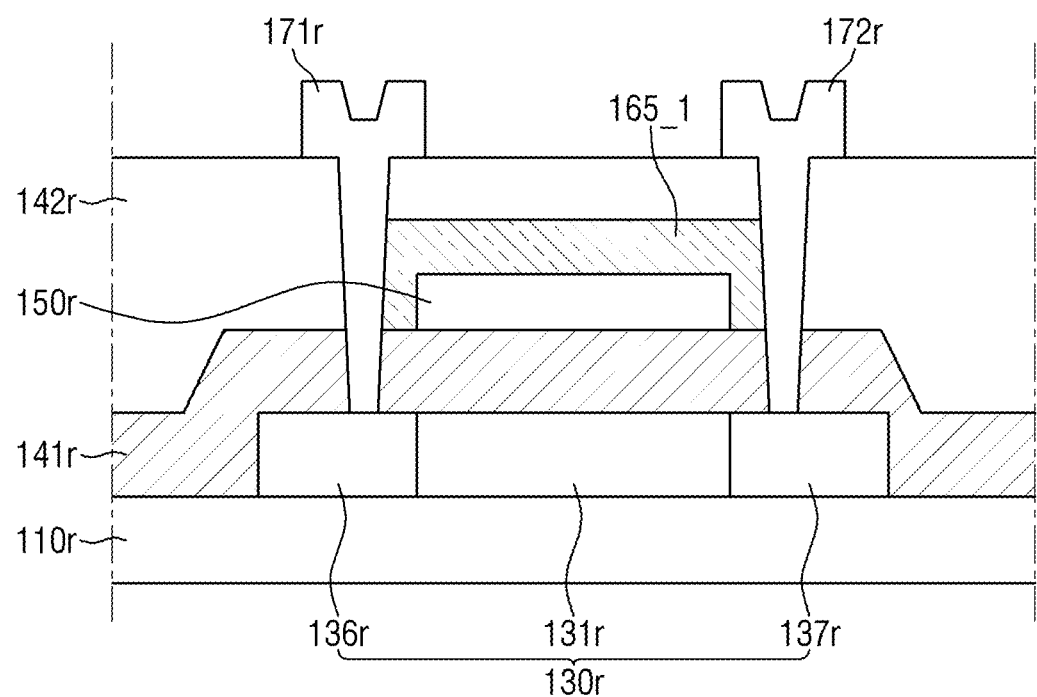
FIG. 15 and FIG. 16 are cross-sectional diagram illustrating various exemplary embodiments of the pixel of FIG. 2.
Figure 16:
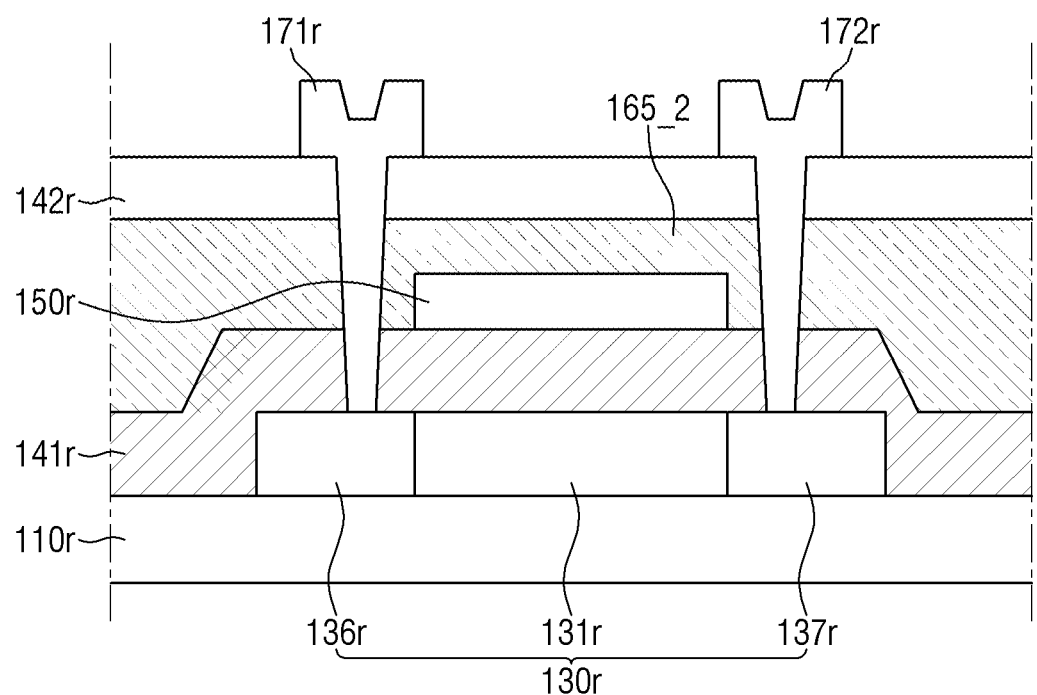

FIGS. 15 and 16 are cross-sectional views showing various exemplary embodiments of the pixel of FIG. 2.

Initially, referring to FIGS. 10 and 15, the pixel PX (or the display device 1) of FIG. 15 is different from the pixel of FIG. 10 in that it includes a ferroelectric layer 165_1.

The ferroelectric layer 165_1 may be substantially identical to the ferroelectric layer 165 shown in FIG. 10, except for its location. Therefore, descriptions of the identical elements will not be made to avoid redundancy.

The ferroelectric layer 165_1 may be disposed on the first insulating layer 141r and may be disposed between the source electrode 171r and the drain electrode 172r of the first transistor T1 to come in direct contact with the source electrode 171r, the drain electrode 172r and the gate electrode of the first transistor T1.

The ferroelectric layer 165_1 may also be disposed between the gate electrode and the source electrode 171r of the first transistor T1 to mitigate the stress applied between them.

Initially, referring to FIGS. 10 and 16, the pixel PX (or the display device 1) of FIG. 16 is different from the pixel of FIG. 10 in that it includes a ferroelectric layer 165_2.

The ferroelectric layer 165_2 may be substantially identical to the ferroelectric layer 165 shown in FIG. 10, except for its location. Therefore, descriptions of the identical elements will not be made to avoid redundancy.

The ferroelectric layer 165_2 may be disposed on the first insulating layer 141r and may be disposed over the entire surface of the substrate 110r.

In this case, the ferroelectric layer 165_2 can be used to mitigate the stress applied between the electrodes of the first transistor T1 and can be formed through a single process together with the second insulating layer 142r, such that the process of fabricating the display device 1 can be simplified.

Figure 17:
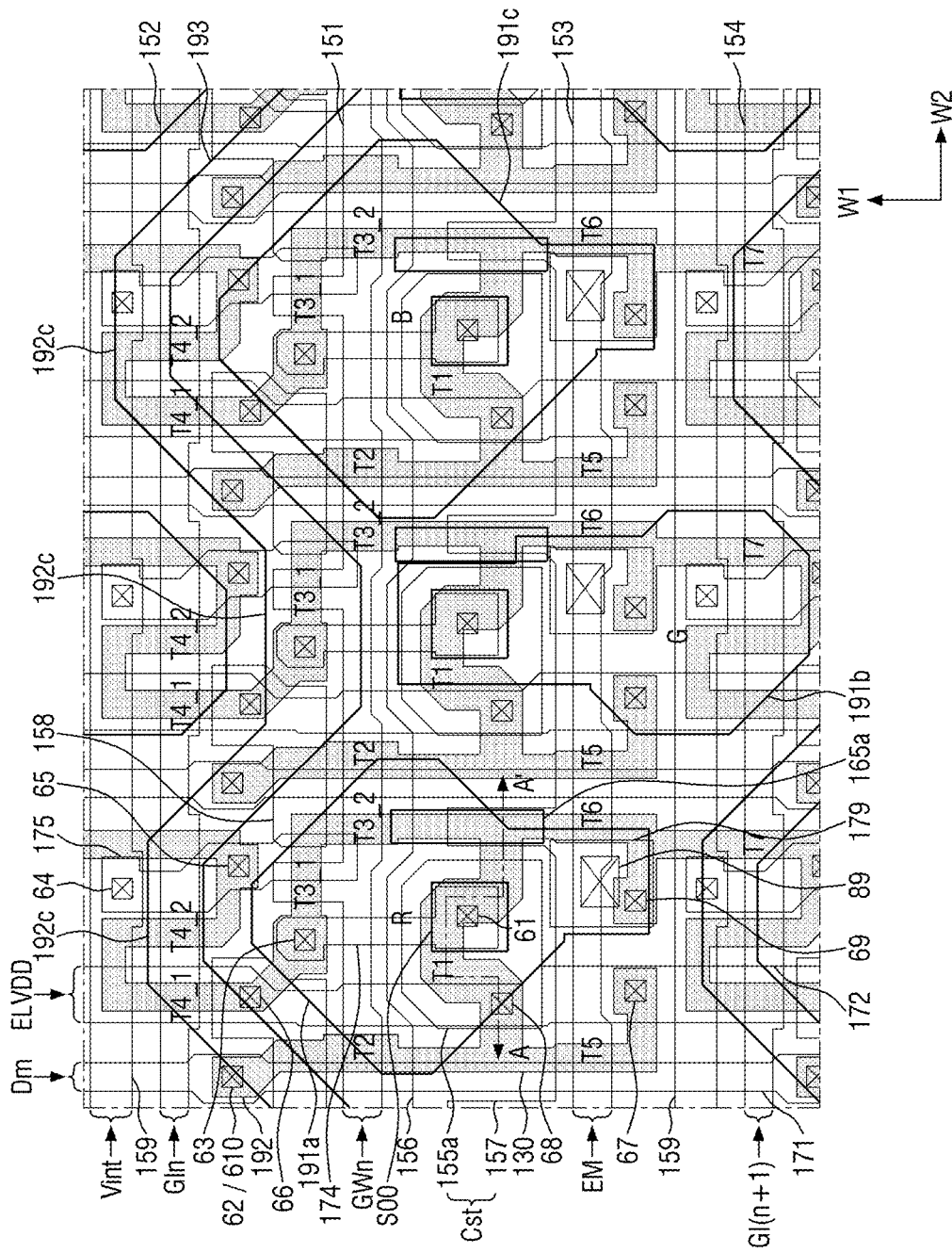
FIG. 17 and FIG. 18 are diagrams illustrating layouts of examples of the display device of FIG. 1.
Figure 18:
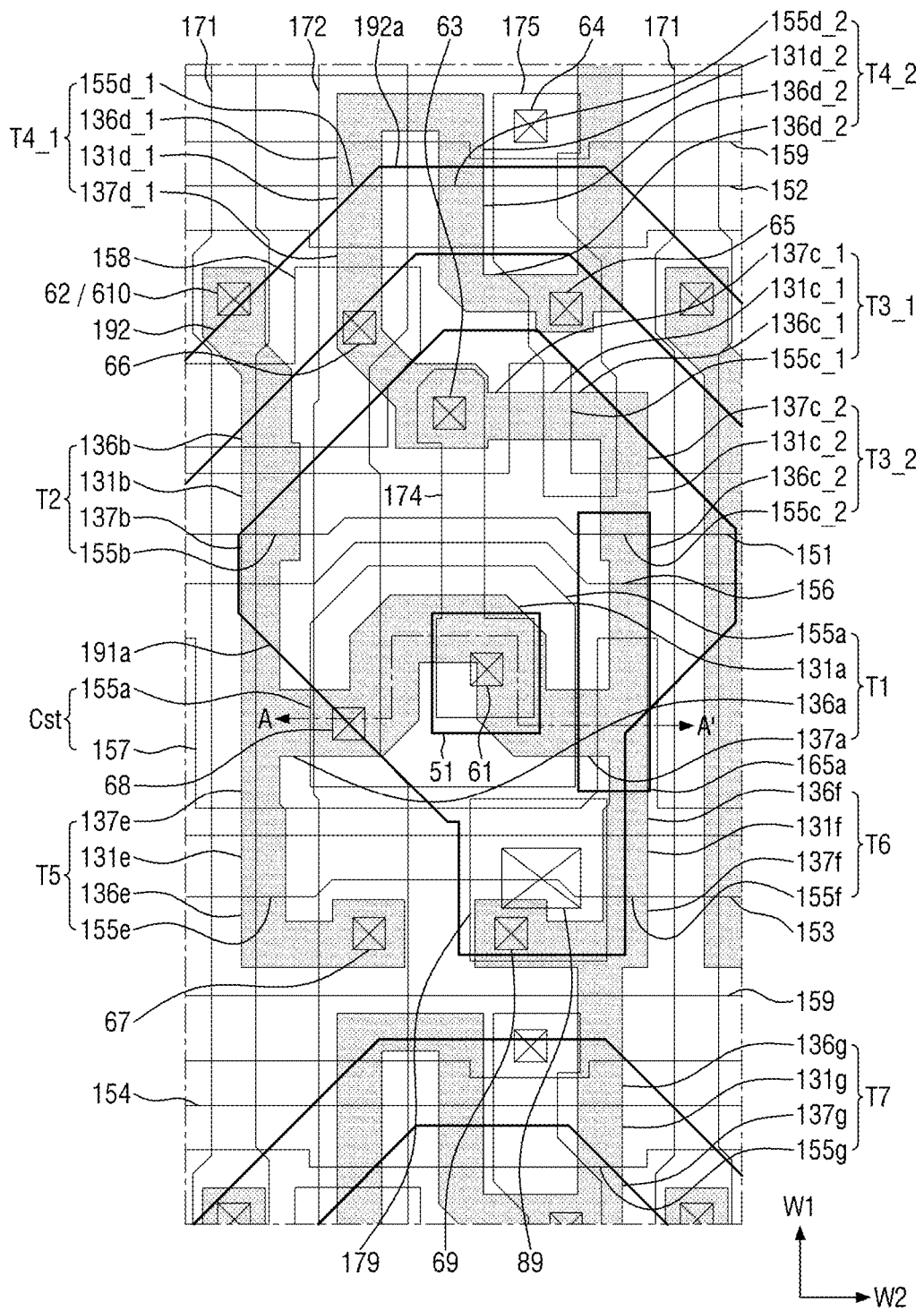

FIGS. 17 and 18 are views showing layouts of examples of the display device of FIG. 1.

Referring to FIGS. 1, 2, 17, 18, and 19 the display device 1 may include pixels R, G, and B for displaying a particular color. The pixels R, G, and B may include a red pixel R for producing red light, a green pixel G for producing green light, and a blue pixel B for producing blue light. In FIG. 17, red pixel R, green pixel G and blue pixel B adjacent one another are shown. Alternatively, at least one of the red pixel R, the green pixel G, and the blue pixel B may represent different colors. Further, the display device 1 may further include pixels for producing other colors than red, green, and blue. In the following description, some elements are identical to those shown in FIG. 1, but are denoted by different numerical numbers.

The substrate 110 may include inorganic or organic insulating materials such as glass and plastic, and may have flexibility.

The first conductive layer 150r may include scan lines 151, 152 and 154 and a control line 153 (or an emission control signal line).

The scan lines 151, 152, and 154 and the control line 153 may be extended generally along the second direction W2 when viewed from the top. The first scan line 151 may be disposed between the second scan line 152 and the control line 153 when viewed from the top. The third scan line 154 may be substantially identical to the second scan line 152 and may transmit the scan signal GI(n+1) next to the scan signal GIn transmitted by the second scan line 152. As described above, when the first scan line 151 transmits the $n^{th}$ scan signal GIn, the third scan line 154 may also transmit the $n^{th}$ scan signal GIn.

In an exemplary embodiment, the display device 1 may further include a second conductive layer including a storage line 156, an initialization voltage line 159, etc. The second conductive layer may be disposed at a layer different from the first conductive layer in the cross section. For example, the second conductive layer may be disposed on the first conductive layer 150 in the cross section and may include the same material and may be located in the same layer.

The storage line 156 and the initialization voltage line 159 may be extended substantially along the second direction W2 when viewed from the top. The storage line 156 may be disposed between the first scan line 151 and the control line 153 when viewed from the top and may include an extension 157 positioned at each of the pixels R, G and B. The extension 157 may be connected to a driving voltage line 172 through the contact hole 68 to receive the first supply voltage ELVDD. A storage opening 51 is formed in the extension 157.

The initialization voltage line 159 may transfer the initialization voltage Vint and may be disposed between the third scan line 154 and the control line 153 when viewed from the top. It is, however, to be understood that the inventive concepts are not limited thereto.

In an exemplary embodiment, the display device 1 may further include a third conductive layer including a data line 171 for transferring a data signal Dm and a driving voltage line 172 for transferring a first supply voltage ELVDD. The third conductive layer may be disposed at a layer different from the first conductive layer and the second conductive layer in the cross section. For example, the third conductive layer may be disposed on the second conductive layer 150 in the cross section and may include the same material and may be located in the same layer.

The data line 171 and the driving voltage line 172 may be extended substantially along the first direction W1 when viewed from the top and may intersect a plurality of scan lines 151, 152, and 154, a control line 153, an initialization voltage line 159, and a storage line 156.

Each of the pixels R, G, and B may include the transistors T1, T2, T3, T4, T5, T6, and T7 connected to the scan lines 151, 152, and 154, the control line 153, the data line 171, and the driving voltage line 172, a capacitor Cst, and an emitting diode ED (or an emitting element EL).

The channel of each of the transistors T1, T2, T3, T4, T5, T6, and T7 may be formed in one semiconductor pattern 130 (or an active pattern) and may be curved in various shapes.

The semiconductor pattern 130 may be disposed between the substrate 110 and the first conductive layer on the cross section.

The semiconductor pattern 130 may include channel regions 131a, 131b, 131c_1, 131c_2, 131d_1, 131d_2, 131e, 131f, and 131g for forming channels of the transistors T1, T2, T3, T4, T5, T6, and T7, respectively, and a conductive region. In an exemplary embodiment, the third transistor T3 and the fourth transistor T4 may have a dual gate structure. In this case, the third transistor T3 may include two channel regions 131c_1 and 131c_2, and the fourth transistor T4 may include two channel regions 131d_1 and 131d_2.

The conductive region of the semiconductor pattern 130 may be located on both sides of each of the channel regions 131a, 131b, 131c_1, 131c_2, 131d_1, 131d_2, 131e, 131f, and 131g and may have a concentration of carrier higher than concentration of carrier of the channel regions 131a, 131b, 131c_1, 131c_2, 131d_1, 131d_2, 131e, 131f, and 131g. The remaining portions of the semiconductor pattern 130 excluding the channel regions 131a, 131b, 131c_1, 131c_2, 131d_1, 131d_2, 131e, 131f, and 131g may be mostly conductive regions. A pair of conductive regions disposed on both sides of each of the channel regions 131a, 131b, 131c_1, 131c_2, 131d_1, 131d_2, 131e, 131f, and 131g of the transistors T1, T2, T3, T4, T5, T6, and T7, respectively, may be the source region and the drain region of the transistors T1, T2, T3, T4, T5, T6, and T7 and may work as the source electrode and the drain electrode.

The first transistor T1 may include a channel region 131a, a source region 136a, and a drain region 137a, which are conductive regions of the semiconductor pattern 130 located on both sides of the channel region 131a, respectively, and a gate electrode 155a, which overlaps with the channel region 131a when viewed from the top.

The channel region 131a of the first transistor T1 may be bent at least once. For example, the channel region 131a may have a meandering shape or a zigzag shape.

The source region 136a and the drain region 137a may be connected on both sides of the channel region 131a when viewed from the top.

The gate electrode 155a may be included in the first conductive layer and may be connected to the connection member 174 through the contact hole 61 and the storage opening 51. The storage opening 51 surrounds the contact hole 61. The connection member 174 may be included in the third conductive layer in the cross section. The connection member 174 may be extended substantially in parallel to the direction in which the data line 171 is extended. The connection member 174 may correspond to the driving gate node GN shown in the circuit diagram shown in FIG. 1 together with the gate electrode 155a.

In the exemplary embodiments, the display device 1 may further include a ferroelectric layer 165a overlapping with the drain region 137a of the first transistor T1. As described above, the ferroelectric layer 165a forms a residual current electric field between the drain electrode and the gate electrode of the first transistor T1, to offset such that at least a part of the electric field formed by the stress voltage Vdg applied across the drain electrode and the gate electrode of the first transistor T1.

As shown in FIGS. 17 and 18, the ferroelectric layer 165a may overlap with the drain region 137a of the first transistor T1. The ferroelectric layer 165a may come in contact with the gate electrode 155a but may not overlap with the gate electrode 155a. The gate electrode 155a forms one electrode of the capacitor Cst, and the ferroelectric overlapping with the gate electrode 155a can function as a memory element.

The ferroelectric layer 165a is extended generally along the first direction W1 and is disposed between the first scan line 151 and the control line 153. It may not overlap with the first scan line 151 and the control line 153.

The second transistor T2 may include a channel region 131b, a source region 136b and a drain region 137b which are conductive regions of the semiconductor pattern 130 located on both sides of the channel region 131b, respectively, and a gate electrode 155b which overlaps with the channel region 131b when viewed from the top. The gate electrode 155b may be part of the first scan line 151. The source region 136b is located above the first scan line 151 when viewed from the top and is connected to the channel region 131b and to the data line 171 through the contact hole 62. The drain region 137b is located below the first scan line 151 when viewed from the top and is connected to the channel region 131b and to the source region 136a of the first transistor T1.

The third transistor T3 may be divided into two portions to prevent leakage current. Specifically, the third transistor T3 may include an upper third transistor T3_1 and a lower third transistor T3_2 which are adjacent to each other and connected to each other.

The upper third transistor T3_1 may include a channel region 131c_1 overlapping with the first scan line 151 when viewed from the top, a source region 136c_1 and a drain region 137c_1 which are conductive regions of the semiconductor pattern 131 located on both sides of the channel region 131c_1, respectively, and a gate electrode 155c_1 which overlaps with the channel region 131c_1. The gate electrode 155c_1 may be a part of the protrusion of the first scan line 151. The drain region 137c 1 is located above the first scan line 151 when viewed from the top and is connected to the connection member 174 through the contact hole 63.

The lower third transistor T3_2 may include a channel region 131c_2 overlapping with the first scan line 151 when viewed from the top, a source region 136c_2 and a drain region 137c_2 which are conductive regions of the semiconductor pattern 130 located on both sides of the channel region 131c_2, respectively, and a gate electrode 155c_2 which overlaps with the channel region 131c_2. The gate electrode 155c_2 is a part of the first scan line 151. The source region 136c_2 of the lower third transistor T3_2 is connected to the drain region 137a of the first transistor T1, and the drain region 137c_2 is connected to the source region 136c_1 of the upper third transistor T3_1.

The fourth transistor T4 may also be divided into two portions to prevent leakage current. Specifically, the fourth transistor T4 may include a left third transistor T4_1 and a right third transistor T4_2 which are adjacent to each other and connected to each other.

The left fourth transistor T4_1 may include a channel region 131d_1 overlapping with the second scan line 152 when viewed from the top, a source region 136d_1 and a drain region 137d_1 which are conductive regions of the semiconductor pattern 130 located on both sides of the channel region 131d_1, respectively, and a gate electrode 155d_1 which overlaps with the channel region 131d_1. The gate electrode 155d_1 may be a part of the second scan line 152. The drain region 137d 1 is located below the second scan line 152 when viewed from the top and is connected to the drain region 137c_1 of the upper third transistor T3_1 and to the connection member 174 through the contact hole 63.

The right fourth transistor T4_2 may include a channel region 131d_2 overlapping with the second scan line 152 when viewed from the top, a source region 136d_2 and a drain region 137d_2 which are conductive regions of the semiconductor pattern 130 located on both sides of the channel region 131d_2, respectively, and a gate electrode 155d_2 which overlaps with the channel region 131d_2. The gate electrode 155d_2 is a part of the second scan line 152. The drain region 137d_2 may be connected to the source region 136d_1 of the left fourth transistor T4_1, and the source region 136d_2 may be connected to the connection member 175 through the contact hole 65.

The connection member 175 may be included in the third conductive layer in the cross section. The connection member 175 may be electrically connected to the initialization voltage line 159 through the contact hole 64.

The fifth transistor T5 may include a channel region 131e, a source region 136e and a drain region 137e which are conductive regions of the semiconductor pattern 130 located on both sides of the channel region 131e, respectively, and a gate electrode 155e which overlaps with the channel region 131e. The gate electrode 155e is a part of the control line 153. The source region 136e is located below the control line 153 when viewed from the top and is connected to the channel region 131e and to the driving voltage line 172 through the contact hole 67. The drain region 137e is located above the control line 153 when viewed from the top and is connected to the channel region 131e and to the source region 136a of the first transistor T1.

The sixth transistor T6 may include a channel region 131f, a source region 136f and a drain region 137f which are conductive regions of the semiconductor pattern 130 located on both sides of the channel region 131f, respectively, and a gate electrode 155f which overlaps with the channel region 131f. The gate electrode 155f may be a part of the control line 153. The source drain region 137f is located above the control line 153 when viewed from the top and is connected to the channel region 131f and to the drain region 137a of the first transistor T1. The drain region 136f is located below the control line 153 when viewed from the top and is connected to the channel region 131f and to the connection member 179 through the contact hole 69. The connection member 179 may be included in the third conductive layer in the cross section.

The seventh transistor T7 may include a channel region 131g, a source region 136g and a drain region 137g which are conductive regions of the semiconductor pattern 130 located on both sides of the channel region 131g, respectively, and a gate electrode 155g which overlaps with the channel region 131g. The gate electrode 155g may be a part of the third scan line 154. The source region 136g is located above the third scan line 154 when viewed from the top and is connected to the channel region 131g and to the drain region 137f of the sixth transistor T6. The drain region 137g may be located below the third scan line 154 when viewed from the top and connected to the connection member 175 through the contact hole 65 to receive the initialization voltage Vint.

The capacitor Cst may include the gate electrode 155a and the extension 157 of the storage line 156 overlapping with each other when viewed from the top as its two terminals. The capacitor Cst can hold the voltage difference equal to the difference between the voltage at the gate electrode 155a and the voltage at the extension 157 of the storage line 156 receiving the first supply voltage ELVDD. The extension 157 of the storage line 156 may have a larger area than the gate electrode 155a when viewed from the top and may cover the entire area of the gate electrode 155a.

The second conductive layer may further include a shielding pattern 158 overlapping with the data line 171. The shielding pattern 158 may be connected to the driving voltage line 172 through the contact hole 66 to receive the first supply voltage ELVDD. The shielding pattern 158 can shield between the driving gate node GN and the data line 171 to thereby block a change in the voltage at the driving gate node GN due to the change of the data signal Dm. The shielding pattern 158 may be eliminated.

In an exemplary embodiment, the display device 1 may further include a fifth conductive layer including pixel electrodes 191a, 191b, and 191c and a pixel conductive pattern 192, etc. The fifth conductive layer may be disposed at a layer different from the first conductive layer, the second conductive layer, the third conductive layer, and the fourth conductive layer in the cross section. For example, the fifth conductive layer may be disposed on the fourth conductive layer in the cross section and may include the same material and may be located in the same layer.

The pixel electrodes 191a, 191b, and 191c may be arranged in a pentile matrix. For example, the pixel electrode 191a of the red pixel R and the pixel electrode 191c of the blue pixel B may be alternately arranged in the horizontal direction, the pixel electrode 191a of the red pixel R and the pixel electrode 191b of the green pixel G may be alternately arranged in the diagonal direction, and the pixel electrode 191c of the blue pixel B and the pixel electrode 191b of the green pixel G may be alternately arranged in another diagonal direction. It is to be noted that the arrangement of the pixel electrodes 191a, 191b, and 191c is not limited thereto, and may be variously altered.

Each of the pixel electrodes 191a, 191b, and 191c may be connected to the connection member 179 through a contact hole 89 to receive a voltage.

The pixel conductive pattern 192 may be bent along the edges of the adjacent pixel electrodes 191a, 191b, and 191c and may include straight line portions 192a, 192b, and 192c and oblique line portions 193 alternately arranged. The straight line portions 192a, 192b, and 192c may be extended substantially parallel to the scan lines 151, 152, and 154, and the oblique line portions 193 may be extended obliquely with respect to the straight line portions 192a, 192b, and 192c. The straight line portion 192a may be adjacent to the upper side of the pixel electrode 191a of the red pixel R, the straight line portion 192b may be adjacent to the upper side of the pixel electrode 191b of the green pixel G, and the straight line portion 192c may be adjacent to the upper side of the pixel electrode 191c of the blue pixel B.

The pixel conductive pattern 192 can transmit the initialization voltage Vint.

Hereinafter, the cross-sectional structure of the display device 1 will be described in detail.

Figure 19:
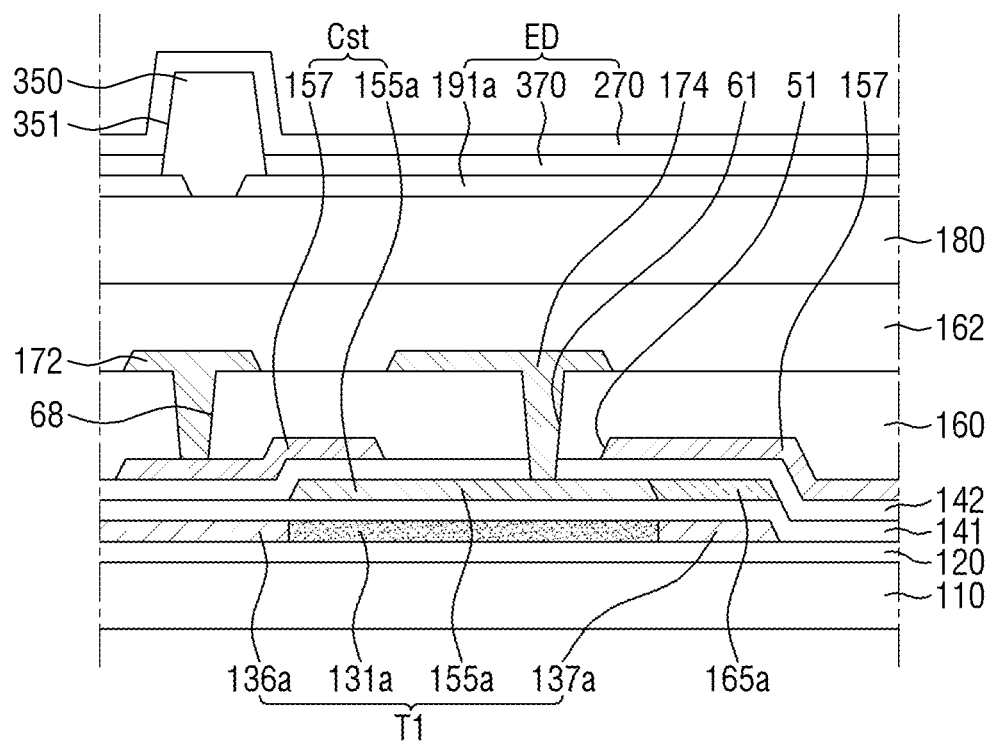
FIG. 19 is a cross-sectional diagram illustrating an example of the display device along the line A-A' of FIG. 18.

FIG. 19 is a cross-sectional view taken along the line A-A' of FIG. 18.

Referring to FIGS. 17 to 19, a buffer layer 120 may be disposed on the substrate 110. The buffer layer 120 may block the transfer of impurities from the substrate 110 into the layer turn on, especially the semiconductor pattern 130, thereby improving the characteristics of the semiconductor pattern 130 and relieving stress. The buffer layer 120 may include an inorganic insulating material such as silicon nitride ($SiN_x$) and silicon oxide ($SiO_x$) and/or an organic insulating material. At least a part of the buffer layer 120 may be eliminated.

As described above, the semiconductor pattern 130 may be disposed on the buffer layer 120, and the first insulating layer 141 may be disposed on the semiconductor pattern 130.

The first conductive layer and the ferroelectric layer 165a described above may be disposed on the first insulating layer 141. The first conductive layer may include a metal, such as copper (Cu), aluminum (Al), molybdenum (Mo), and an alloy thereof. The ferroelectric layer 165a may include, for example, a tantalum carbonate ($BaTiO_3$), strontium titanate ($SrTiO_3$), or the like, as a ferroelectric substance.

The second insulating layer 142 may be disposed on the first conductive layer, the ferroelectric layer 165a and the first insulating layer 141.

The second conductive layer described above may be disposed on the second insulating layer 142. The second conductive layer may include a metal, such as copper (Cu), aluminum (Al), molybdenum (Mo), and an alloy thereof.

A third insulating layer 160 may be disposed on the second conductive layer 142 and the second insulating layer 142.

At least one of the first insulating layer 141, the second insulating layer 142, and the third insulating layer 160 may include an inorganic insulating material such as silicon nitride ($SiN_x$) and silicon oxide ($SiO_x$) and/or an organic insulating material.

In the first insulating layer 141, the second insulating layer 142, and the third insulating layer 160, a contact hole 61 located above the gate electrode 155a, a contact hole 62 located above the source region 136b of the second transistor T2, a contact hole 63 located above the drain region 137c_1 of the upper third transistor T3_1 or the drain region 137d_1 of the left fourth transistor T4_1, a contact hole 64 located above the initialization voltage line 159, a contact hole 65 located above the source region 136d_2 of the right fourth transistor T4_2 or the drain region 137g of the seventh transistor T7, a contact hole 66 located above the shielding pattern 158, a contact hole 67 located above the source region 136e of the fifth transistor T5, a contact hole 68 located above the extension 157 of the storage line 156, and a contact hole 69 located above the drain region 137f of the sixth transistor T6 may be formed.

The third conductive layer described above may be disposed on the third insulating layer 160. The third conductive layer may include a metal such as copper (Cu), aluminum (Al), molybdenum (Mo), and an alloy thereof.

The extension 157 of the storage line 156 may overlap with the gate electrode 155a with the second insulating layer 142 therebetween, to form a capacitor Cst.

A fourth insulating layer 162 may be disposed on the third conductive layer and the third insulating layer 160.

The fourth insulating layer 162 may include an inorganic insulating material such as silicon nitride ($SiN_x$) and silicon oxide ($SiO_x$) and/or an organic insulating material.

A contact hole 610 may be formed in the fourth insulating layer 162 above the data line 171.

The fourth conductive layer described above may be disposed on the fourth insulating layer 162. The fourth conductive layer may include a metal, such as copper (Cu), aluminum (Al), molybdenum (Mo), and an alloy thereof.

A passivation layer 180 is disposed on the fourth conductive layer and the fourth insulating layer 162. The passivation layer 180 may include an organic insulating material, such as polyacrylics resin and polyimide resin, and may have a substantially flat upper surface. The passivation layer 180 may include a contact hole 89 formed above the connection member 179.

The above-described fifth conductive layer may be disposed on the passivation layer 180.

A pixel defining layer (PDL) 350 may be disposed on the passivation layer 180 and the fifth conductive layer. The pixel defining layer 350 may have an opening 351 located above the pixel electrodes 191a, 191b, and 191c.

An emitting layer 370 may be disposed on the pixel electrodes 191a, 191b and 191c. The emitting layer 370 may be located within the opening 351. The emitting layer 370 may include an organic light-emitting material or an inorganic light-emitting material.

The common electrode 270 may be disposed on the emitting layer 370. The common electrode 270 may also be formed on the pixel defining layer 350 and may be extended across a plurality of pixels.

The pixel electrodes 191a, 191b, and 191c, the emitting layer 370 and the common electrode 270 together may form a light-emitting diode (LED).

An encapsulation layer (not shown) for protecting the light-emitting diode ED may be further disposed on the common electrode 270. The encapsulation layer may include inorganic films and organic films stacked on one another alternately.

As described above with reference to FIGS. 17 to 19, the display device 1 may include the ferroelectric layer 165a disposed between the drain electrode and the gate electrode of the first transistor T1. Therefore, the deterioration of the first transistor T1 due to the stress voltage Vdg across the drain electrode and the gate electrode of the first transistor T1 and a change in the electrical characteristics can be prevented or mitigated.

Figure 20:
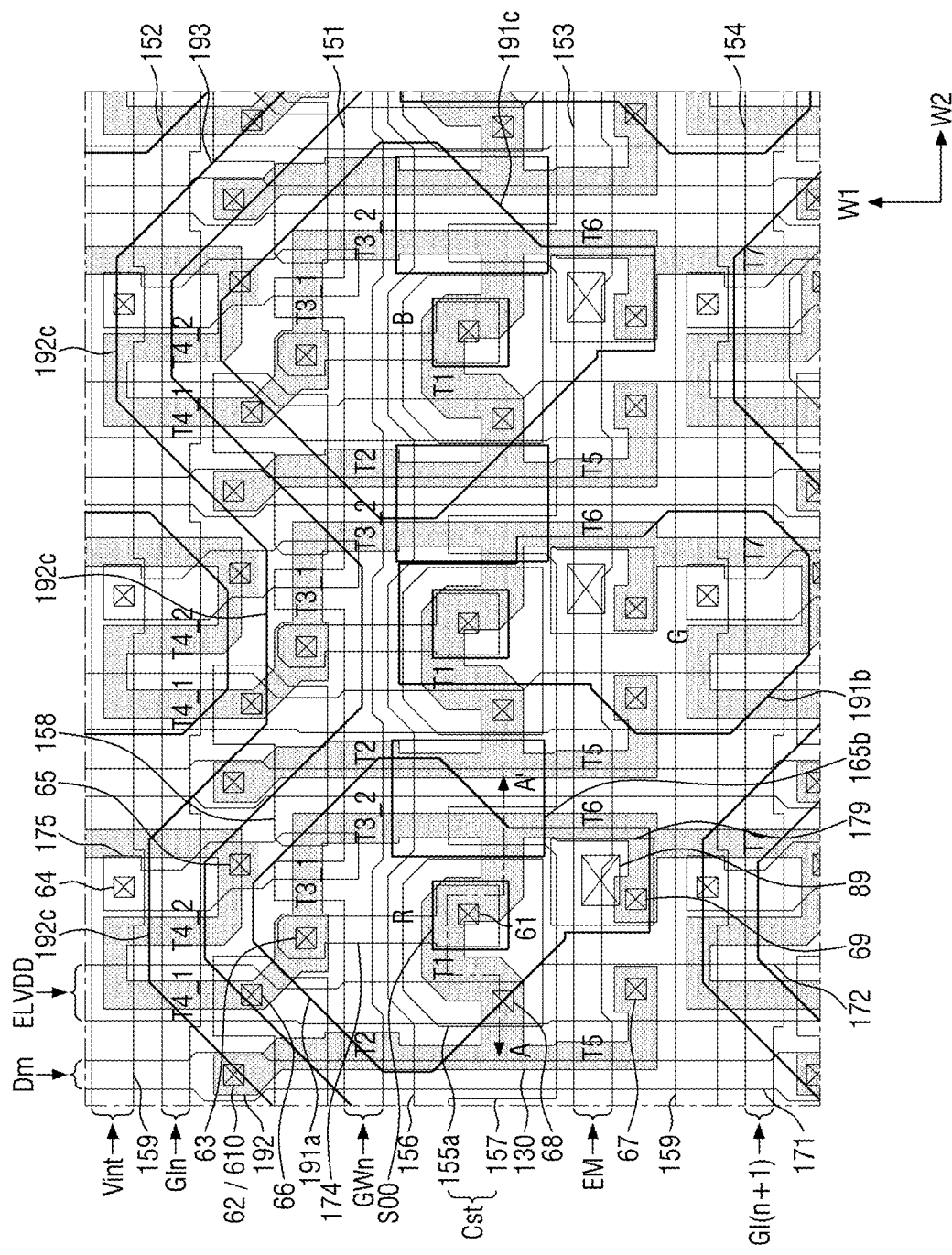
FIG. 20 is a diagram illustrating a layout of another example of the display device of FIG. 1.

FIG. 20 is a view diagram showing a layout of another example of the display device of FIG. 1.

Referring to FIGS. 17 to 20, the display device 1 is different from the display device 1 described above with reference to FIG. 17 in that it includes a ferroelectric layer 165b.

The ferroelectric layer 165b may overlap with the drain region 137a of the first transistor T1 and also has a source region 136a of the first transistor T1 (or the first transistor T1 included in another pixel). In addition, as described above with reference to FIGS. 17 to 19, the ferroelectric layer 165b may not overlap with the gate electrode 155a of the first transistor T1.

As shown in FIG. 20, the ferroelectric layer 165b may overlap with the drain region 137a of the first transistor T1 included in the red pixel R, and with the source region 136a of the transistor T1 included in the blue pixel B.

Therefore, the ferroelectric layer 165b can be used to mitigate the stress applied between the electrodes of the first transistor T1 and can be formed through a simpler fabricating process.

According to an exemplary embodiment of the present disclosure, it is possible to prevent the electrical characteristics of transistors from being changed due to voltage applied to the transistors.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate;
   a semiconductor layer disposed on the substrate, the semiconductor layer comprising a first region, a second region disposed on one side of the first region where a first electrode of a transistor is formed, and a third region disposed on another side of the first region where a second electrode of the transistor is formed;
   a first insulating layer disposed on the semiconductor layer;
   a first conductive layer disposed on the first insulating layer and comprising a gate electrode overlapping with the first region; and
   a ferroelectric layer disposed on the first insulating layer and overlapping with at least a part of the second region of the semiconductor layer,
   wherein the ferroelectric layer contacts upper and lateral side surfaces of the first conductive layer and a side surface, and not top and bottom surfaces, of at least the second electrode.

2. The display device of claim 1, wherein the ferroelectric layer is in direct contact with the gate electrode and partially overlaps with the gate electrode.

3. The display device of claim 2, wherein the ferroelectric layer overlaps with at least a part of the first region.

4. The display device of claim 1, wherein the ferroelectric layer is in direct contact with the gate electrode and does not overlap with the gate electrode.

5. The display device of claim 4, wherein the ferroelectric layer overlaps with at least a part of the first region.

* * * * *